(12) United States Patent
Han et al.

(10) Patent No.: US 11,935,953 B2
(45) Date of Patent: Mar. 19, 2024

(54) SEMICONDUCTOR DEVICES

(71) Applicant: Samsung Electronics Co., Ltd., Suwon-si (KR)

(72) Inventors: Donghwan Han, Hwaseong-si (KR); Seungchan Yun, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/967,950

(22) Filed: Oct. 18, 2022

(65) Prior Publication Data

US 2023/0045681 A1 Feb. 9, 2023

Related U.S. Application Data

(63) Continuation of application No. 17/026,551, filed on Sep. 21, 2020, now Pat. No. 11,482,619.

(30) Foreign Application Priority Data

Dec. 10, 2019 (KR) ........................ 10-2019-0163652

(51) Int. Cl.
*H01L 29/78* (2006.01)
*H01L 21/8238* (2006.01)
*H01L 27/092* (2006.01)
*H01L 27/12* (2006.01)
*H01L 29/08* (2006.01)

(52) U.S. Cl.
CPC .... *H01L 29/785* (2013.01); *H01L 21/823864* (2013.01); *H01L 27/0924* (2013.01); *H01L 27/1211* (2013.01); *H01L 21/823814* (2013.01); *H01L 29/0847* (2013.01); *H01L 2029/7858* (2013.01)

(58) Field of Classification Search
CPC ............... H01L 29/785; H01L 29/0847; H01L 21/823864; H01L 21/823814; H01L 27/0924; H01L 27/1211
See application file for complete search history.

(56) References Cited

U.S. PATENT DOCUMENTS

| | | | |
|---|---|---|---|
| 9,196,694 B2 | 11/2015 | Bouche et al. | |
| 9,520,327 B2 | 12/2016 | Nieh et al. | |
| 9,543,435 B1 | 1/2017 | Basker et al. | |
| 9,805,973 B2 | 10/2017 | Adusumilli et al. | |
| 9,870,958 B2 | 1/2018 | Cheng et al. | |
| 2015/0194518 A1 | 7/2015 | Cheng et al. | |
| 2016/0204026 A1 | 7/2016 | Liu et al. | |
| 2017/0287902 A1* | 10/2017 | Balakrishnan | ........ H01L 29/517 |
| 2019/0115249 A1 | 4/2019 | Koh et al. | |
| 2019/0181012 A1 | 6/2019 | Gluschenkov et al. | |
| 2020/0043793 A1* | 2/2020 | Huang | ............. H01L 21/31116 |

FOREIGN PATENT DOCUMENTS

WO 2018125216 A1 7/2018

* cited by examiner

*Primary Examiner* — Christine A Enad
(74) *Attorney, Agent, or Firm* — Myers Bigel, P.A.

(57) ABSTRACT

A semiconductor device includes a substrate including an active region that extends in a first direction; a gate structure that intersects the active region and that extends in a second direction; a source/drain region on the active region on at least one side of the gate structure; a contact plug on the source/drain region on the at least one side of the gate structure; and a contact insulating layer on sidewalls of the contact plug, wherein a lower end of the contact plug is closer to the substrate than a lower end of the source/drain region.

19 Claims, 23 Drawing Sheets

SEMICONDUCTOR DEVICES

CROSS-REFERENCE TO RELATED APPLICATIONS

This patent application is a continuation of U.S. patent application Ser. No. 17/026,551 filed Sep. 21, 2020, which claims the benefit under 35 U.S.C. § 119(a) of Korean Patent Application No. 10-2019-0163652 filed on Dec. 10, 2019, in the Korean Intellectual Property Office, and the entire disclosure of each above-identified application is incorporated by reference for all purposes.

BACKGROUND

The present disclosure relates to a semiconductor device.

As demand increases for relatively high performance, relatively high speed, and/or multifunctioning of semiconductor devices, so does a degree to which the semiconductor devices are integrated. In order to manufacture semiconductor devices having fine patterns corresponding to a relatively high degree of integration, equipment to produce patterns having a fine width or a fine separation distance may be desired. In addition, in order to overcome the limitations of the operating characteristics due to a decrease in a size of a planar metal oxide semiconductor FET (MOSFET), efforts have been made to develop semiconductor devices including FinFETs having three-dimensional channels.

SUMMARY

Aspects of present inventive concepts provide a semiconductor device having improved electrical characteristics.

According to some aspects of the present inventive concepts, a semiconductor device includes a substrate including an active region that extends in a first direction; a gate structure that intersects the active region and that extends in a second direction; a source/drain region on the active region on at least one side of the gate structure; a contact plug on the source/drain region on the at least one side of the gate structure; and a contact insulating layer on sidewalls of the contact plug, wherein a lower end of the contact plug is located closer to the substrate than a lower end of the source/drain region.

According to some aspects of the present inventive concepts, a semiconductor device includes a substrate having a first region and a second region, and including active regions that extends in a first direction; gate structures respectively on the first and second regions, that intersect the active regions, and that extend in a second direction; source/drain regions on the active regions on at least one sides of the gate structures, and including metal-semiconductor layers in upper ends; contact plugs on the at least one sides of the gate structures, having portions of outer surfaces in contact with the source/drain regions, and having lower ends located on a level lower than lower ends of the source/drain regions; and contact insulating layers on sidewalls of the contact plugs, wherein each of the gate structures includes a gate insulating layer and a gate electrode layer stacked sequentially on the substrate, and gate spacer layers on sidewalls of the gate electrode layer in the first direction, wherein a first distance between the gate electrode layer and each of the contact plugs, adjacent to the gate electrode layer in the first region is shorter than a second distance between the gate electrode layer and each of the contact plugs, adjacent to the gate electrode layer in the second region.

According to some aspects of the present inventive concepts, a semiconductor device includes a substrate including active regions that extend in a first direction; gate structures including gate electrode layers that intersect the active regions and that extend in a second direction; source/drain regions on the active regions on at least one sides of the gate structures; contact plugs on the source/drain regions on the at least one sides of the gate structures; contact insulating layers that contact the gate structures and that surround sidewalls of the contact plugs; and a sidewall insulating layer that contacts a portion of an outer surface of the source/drain regions and that contacts the contact plugs.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

Figure 1:
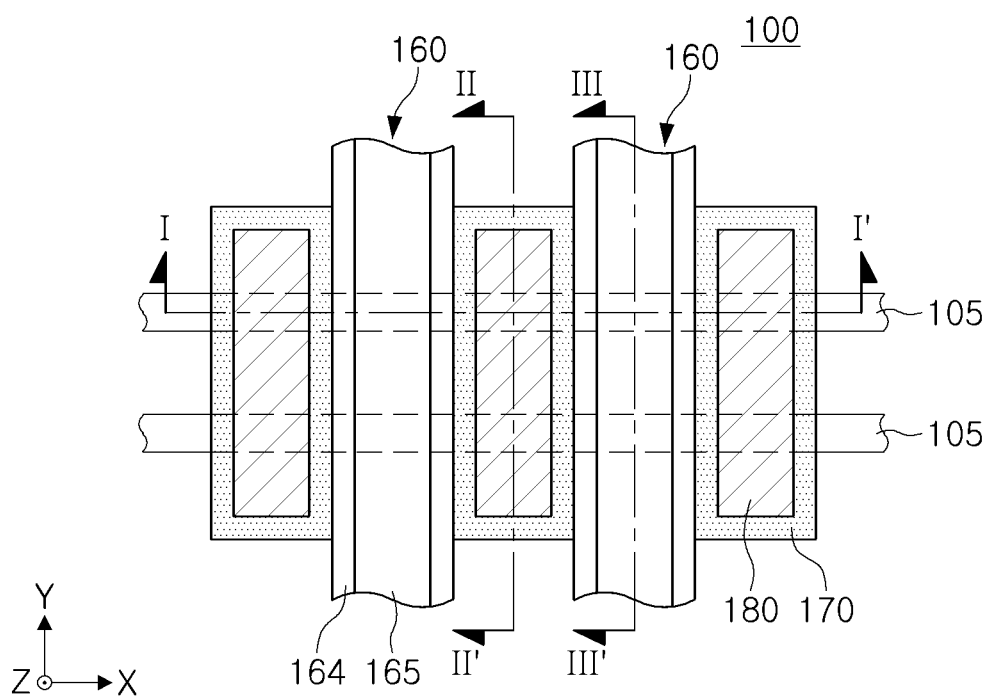
FIG. 1 is a plan view illustrating a semiconductor device according to some example embodiments.
Figure 2A:
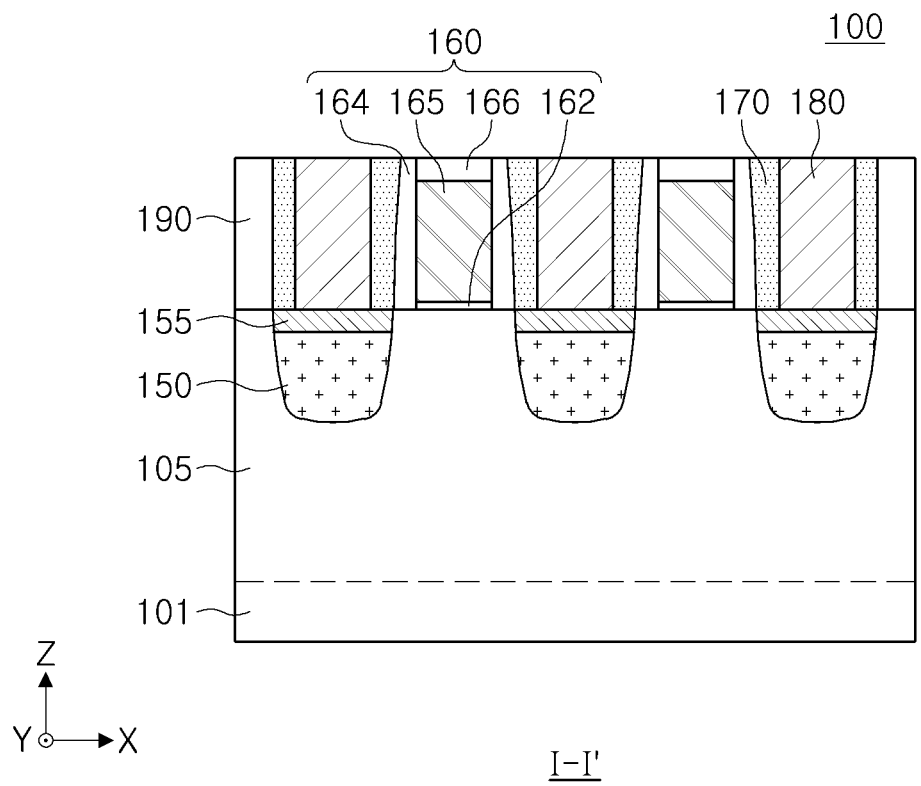
FIGS. 2A to 2C are cross-sectional views illustrating a semiconductor device according to some example embodiments.
Figure 2B:
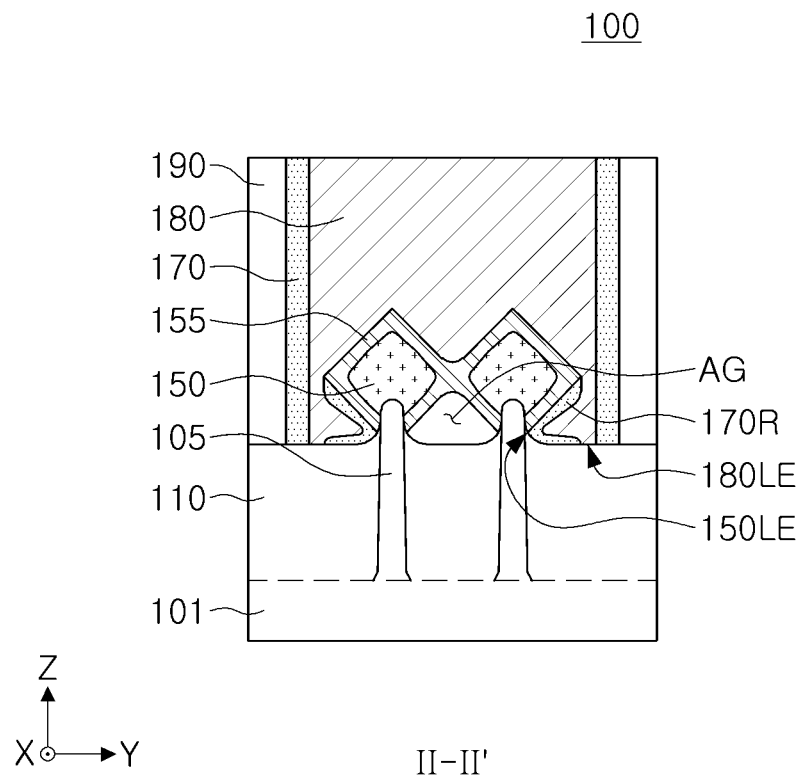
Figure 2C:
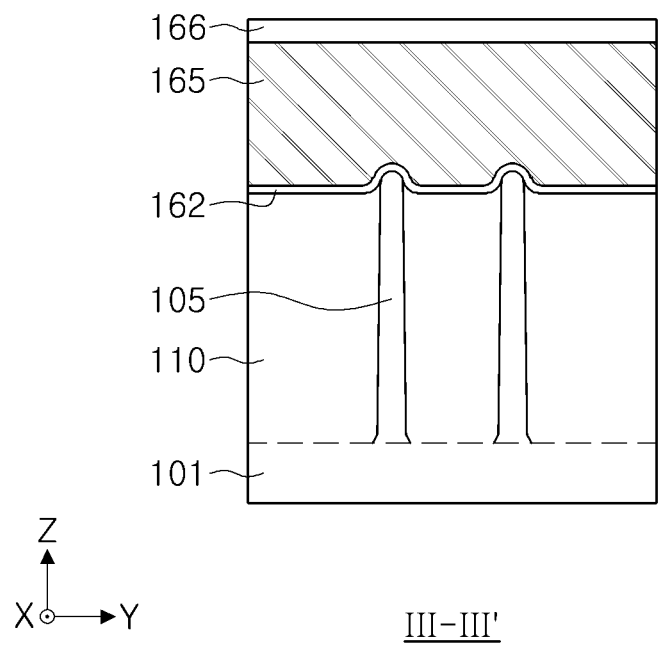

FIG. 1 is a plan view illustrating a semiconductor device according to some example embodiments. FIGS. 2A to 2C are cross-sectional views illustrating a semiconductor device according to some example embodiments. FIGS. 2A to 2C illustrate cross-sectional views taken along lines I-I', II-II', and III-III' of the semiconductor device of FIG. 1, respectively. For convenience of description, only main components of the semiconductor device may be illustrated in FIGS. 1 to 2C.

Referring to FIGS. 1 to 2C, a semiconductor device 100 may include a substrate 101, active regions 105, a device isolation layer 110, source/drain regions 150, gate structures 160, contact insulating layers 170, contact plugs 180, and an interlayer insulating layer 190. The semiconductor device 100 may include FinFET devices, which may be transistors in which the active regions 105 have a fin structure. The FinFET devices may include transistors arranged around the active regions 105 and the gate structures 160, intersecting each other.

The substrate 101 may have an upper surface extending in X and Y directions. The substrate 101 may include a semiconductor material, such as a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be provided as a bulk wafer, an epitaxial layer, a silicon-on-insulator (SOI) layer, or a semiconductor-on-insulator (SeOI) layer.

As best seen in FIGS. 2B and 2C, the device isolation layer 110 may define the active regions 105 in the substrate 101. The device isolation layer 110 may be formed by, for example, a shallow trench isolation (STI) process. In some example embodiments, the device isolation layer 110 may include a region extending deeply into a lower portion of the substrate 101. The device isolation layer 110 may have an upper surface having a curved shape and a relatively high level, as the device isolation layer 110 is closer to the active regions 105, but a shape of the upper surface of the device isolation layer 110 is not limited thereto. The device isolation layer 110 may be made of an insulating material. The device isolation layer 110 may be, for example, an oxide, a nitride, or a combination thereof.

The active regions 105 may be defined by the device isolation layer 110 in the substrate 101, and may be extend in a first direction. The first direction may be, for example, the X direction. The active regions 105 may have a structure protruding from the substrate 101. Upper ends of the active regions 105 may protrude from the upper surface of the device isolation layer 110 to a predetermined height. The active regions 105 may be formed as portions of the substrate 101, or may include an epitaxial layer that is grown from the substrate 101. For purposes of the present description, the substrate 101 may be considered as including the active regions 105, or the active regions 105 may be considered as being on the substrate 101. The active regions 105 on the substrate 101 may be partially recessed on both sides of the gate structures 160, and the source/drain regions 150 may in the recesses of the active regions 105. In some example embodiments, the active regions 105 may have doped regions including impurities. For example, the active regions 105 may include impurities diffused from the source/drain regions 150 in a region contacting the source/drain regions 150. In some example embodiments, the active regions 105 may include first and second semiconductor layers alternately stacked in upper regions located alongside the source/drain regions 150 in the X direction. In some example embodiments, the active regions 105 may have a structure of which an upper surface has a planar shape, rather than a fin structure.

As discussed, the source/drain regions 150 may be on both sides of the gate structures 160, and the source/drain regions 150 may be in recessed regions of the active regions 105. The recessed regions of the active regions 105 may have extend between the gate structures 160 in the X direction. The source/drain regions 150 may be provided as source or drain regions of the transistors. The source/drain regions 150 may include metal-semiconductor layers 155, arranged on upper ends of the source/drain regions 150.

As illustrated in FIG. 2A, when viewed in a cross-sectional view along the X direction, upper surfaces of the source/drain regions 150 may be substantially planar, and the upper surfaces of the source/drain regions 150 may be substantially coplanar with the upper surface of the substrate 101. The upper surfaces of the source/drain regions 150 may be located on the same or a similar height level as lower surfaces of the gate structures 160, when viewed in a cross-sectional view along the X direction. Relative heights of the source/drain regions 150 and the gate structures 160 may be different within different example embodiments. For example, when the metal-semiconductor layers 155 of the source/drain regions 150 are formed to protrude from the substrate 101, the source/drain regions 150 may have an elevated source/drain shape such that the upper surfaces of the source/drain regions 150 are located higher than the lower surfaces of the gate structures 160. The source/drain regions 150 may be below outer surfaces of the gate spacer layers 164 so as not to overlap the gate structures 160 between adjacent gate structures 160, but the present disclosure is not limited thereto. For example, the source/drain regions 150 may have a shape extending below the gate structures 160 in the X direction.

The source/drain regions 150 may have a curved shape such as a portion of a circle, a portion of an ellipse, or a similar shape, below the upper surface having a planar shape. In some example embodiments, the shape below the upper surface may be different in various example embodiments, depending on a distance between adjacent gate structures 160, heights of the active regions 105, or the like. The upper surfaces of the source/drain regions 150 may be covered by the contact insulating layers 170 and the contact plugs 180, and in some example embodiments, the upper surfaces of the source/drain regions 150 may be entirely covered by the contact insulating layers 170 and the contact plugs 180. Therefore, on the upper surface of the source/drain regions 150, a width of one of the source/drain regions 150 in the X direction may be substantially equal to the sum of a width of the contact plug 180, disposed thereon, and two widths of the contact insulating layers 170, disposed on both sides of the contact plug 180.

As illustrated in FIG. 2B, the source/drain regions 150 may have a pentagonal shape or a similar shape, when viewed in a cross-sectional view along the Y direction. In some example embodiments, the source/drain regions 150 may have any one of a number of various shapes. For example, the source/drain regions 150 may have a shape of any polygon, a circle, an ellipse, or a rectangle. As illustrated in FIG. 2B, outer surfaces of the source/drain regions 150 may have sloped shapes. Specifically, the outer surfaces of the source/drain regions 150 may have first surfaces having a slope to increase a width in the Y direction and extending obliquely from the active regions 105 in the upward direction, and second surfaces having a slope to decrease the width in the Y direction, extending obliquely from the first surfaces in the upward direction. The second surfaces may be referred to as upper surfaces. Outer first surfaces among the first surfaces may be in contact with sidewall insulating layers 170R, and the second surfaces may be in contact with the contact plugs 180. Sidewall insulating layers 170R may not be arranged on or in contact with inner first surfaces among the first surfaces, where the inner first surfaces are located between the active regions 105.

As illustrated in FIG. 2B, the source/drain regions 150 may be connected to each other between the active regions 105, adjacent to each other in the Y direction, but the present disclosure is not limited thereto. According to some example embodiments, the source/drain regions 150 may not be connected by the metal-semiconductor layers 155 between adjacent active regions 105 in the Y direction, but may have a form connected by regions other than the metal-semiconductor layers 155. An air-gap region AG between the source/drain regions 150 and the device isolation layer 110 may exist below a region in which the source/drain regions 150 are connected to each other between adjacent active regions 105, but the present disclosure is not limited thereto. For example, air-gap regions AG may be further provided below the outer first surfaces, on which the sidewall insulating layers 170R are disposed.

The metal-semiconductor layers 155 may be on the source/drain regions 150 to form the upper surface of the source/drain regions 150. Therefore, the metal-semiconductor layers 155 may be directly in contact with the contact plugs 180 through the upper surface of the source/drain regions 150. The metal-semiconductor layers 155 may lower contact resistance between the source/drain regions 150 and the contact plugs 180. In some example embodiments, upper surfaces of the metal-semiconductor layers 155 may have a shape that partially protrudes from the substrate 101. In some example embodiments, an arrangement of the metal-semiconductor layers 155 in the source/drain regions 150 may be changed variously. In some example embodiments, as illustrated in the cross-sectional view of FIG. 2B, the metal-semiconductor layers 155 may not be in a lower portion of the source/drain regions 150 including the first surfaces, but may only be in an upper portion of the source/drain regions 150.

The source/drain regions 150 may be formed of an epitaxial layer, and may include, for example, silicon (Si), silicon germanium (SiGe), or silicon carbide (SiC). The source/drain regions 150 may further include impurities such as arsenic (As) and/or phosphorus (P). In some example embodiments, the source/drain regions 150 may include a plurality of regions including different concentrations of elements and/or doping elements. The metal-semiconductor layers 155 may include a semiconductor element included in the lower region of the source/drain regions 150 and a metal element. The metal-semiconductor layers 155 may include, for example, titanium silicide (TiSi), nickel silicide (NiSi), cobalt silicide (CoSi), tungsten silicide (WSi), or other metal silicides, and may also include germanium (Ge) or silicon germanium (SiGe), instead of silicon (Si).

The gate structures 160 may intersect the active regions 105 in an upper portion of the active regions 105. The gate structures 160 may extend in one direction, for example, the Y direction. A channel region of a transistor may be formed in the active regions 105 that intersect the gate structures 160. The "channel region" may refer to a region including a depletion region of the transistor, and may refer to a region of the active regions 105, intersecting the gate structures 160 and adjacent to the gate structures 160. The gate structures 160 may include a gate insulating layer 162, a gate electrode layer 165, gate spacer layers 164, and a gate capping layer 166, respectively.

The gate insulating layer 162 may be between the active region 105 and the gate electrode layer 165. In example embodiments, the gate insulating layer 162 may be formed of a plurality of layers or may extend onto a side surface of the gate electrode layer 165. The gate insulating layer 162 may include oxide, nitride, or a high dielectric constant (high-k) material. The high dielectric constant material may refer to a dielectric material having a dielectric constant higher than that of silicon oxide ($SiO_2$). The high dielectric constant material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode layer 165 may include a conductive material, and may include, for example, a metal nitride such as titanium nitride (TiN), tantalum nitride (TaN), tungsten nitride (WN), or the like, and/or a metal material such as aluminum (Al) or tungsten (W), molybdenum (Mo), or the like, or a semiconductor material such as doped polysilicon or the like. The gate electrode layer 165 may include two or more layers. The gate electrode layer 165 may be separated and arranged between at least portions of adjacent transistors, according to a configuration of the semiconductor device 100.

The gate spacer layers 164 may be on both side surfaces of the gate electrode layer 165. The gate spacer layers 164 may insulate the source/drain regions 150 from the gate electrode layer 165. The gate spacer layers 164 may be formed to have a multilayer structure, according to some example embodiments, and a slope of an outer surface of the gate spacer layers 164 may also be different in various example embodiments. The gate spacer layers 164 may be formed of oxide, nitride, and oxynitride, and, in particular, may be formed of a low dielectric constant film. The gate spacer layers 164 may include, for example, at least one of SiO, SiN, SiCN, SiOC, SiON, or SiOCN.

The gate capping layer 166 may be disposed on the gate electrode layer 165, and a lower surface and side surfaces of the gate capping layer 166 may be surrounded by the gate electrode layer 165 and the gate spacer layers 164, respectively.

The contact plugs 180 may extend from the upper portion of the semiconductor device 100 toward the substrate 101 to be connected to the source/drain regions 150, and may apply an electrical signal to the source/drain regions 150. The contact plugs 180 may be on the source/drain regions 150 to contact the upper surface of the source/drain regions 150 without recessing the source/drain regions 150, as illustrated in FIGS. 2A and 2B. Lower surfaces of the contact plugs 180 may be located on substantially the same height level as the lower surfaces of the gate structures 160, or may be located on a higher level than the lower surfaces of the gate structures 160. The contact plugs 180 may be connected to a via or a wiring line in the upper portion thereof, which is not illustrated.

The contact plugs 180 may have a width greater than 10 nm in the X direction, for example, in the range of about 10 nm to about 100 nm, respectively. When the width of each of the contact plugs 180 is smaller than the range defined above, contact resistance may increase and process difficulty may increase. When the width of each of the contact plugs 180 is larger than the range defined above, a size of the semiconductor device 100 may increase.

The contact plugs 180 may have a length larger than a length of the source/drain regions 150 in the Y direction. For example, as illustrated in FIG. 2B, both end portions of the contact plug 180 may be spaced apart from both end portions of the source/drain region 150 externally, when viewed in a cross-sectional view along the Y direction, and may completely cover the source/drain region 150. Therefore, the contact plugs 180 may extend relatively deeper than the source/drain regions 150. For example, a lower end 180LE or a lowermost surface of the contact plugs 180 may be located on a lower level or a lower height than a lower end 150LE or a lowermost surface of the source/drain regions 150. For example, the lower end 180LE of the contact plugs 180 may be located below the first surfaces of the source/drain regions 150. The length of the contact plugs 180 in the Y direction may be determined or selected in consideration of parasitic capacitance between the contact plugs 180 and the gate electrode layers 165. The contact plugs 180 may have sloped side surfaces in which a length of a lower portion of the contact plugs 180 may be smaller than a length of an upper portion of the contact plugs 180, depending on an aspect ratio, but the present disclosure is not limited thereto. The contact plugs 180 may include a conductive material, for example, a metal material such as tungsten (W), aluminum (Al), copper (Cu), or the like, or a semiconductor material such as doped polysilicon or the like.

Since the contact plugs 180 may not substantially recess the source/drain regions 150 such that profiles of the source/drain regions 150 are maintained as described above, and as illustrated in FIG. 2B, the contact plugs 180 may be arranged along profiles of the second surfaces of the source/drain regions 150, a contact area may be maximized to reduce contact resistance. Even when the source/drain regions 150 are used to control the mobility of electric charge in the channel region of the transistor by applying stress, the source/drain regions 150 may not be recessed, thereby the stress may not be released.

The contact insulating layers 170 may be arranged on both of the sidewalls of the contact plugs 180 in the X direction. The contact insulating layers 170 may fill areas or regions between the contact plugs 180 and the gate structures 160 and between the contact plugs 180 and the interlayer insulating layer 190. The contact insulating layers 170 may have a hollow shape to completely surround the entire sidewalls of each of the contact plugs 180, when viewed in a plan view, as illustrated in FIG. 1. The contact insulating layers 170 may surround the contact plugs 180 with a substantially uniform thickness. In particular, the contact insulating layer 170 may fill a region between adjacent the gate structures 160 together with the contact plug 180, and may contact the gate spacer layer 164 of each of the gate structures 160. Lower surfaces of the contact insulating layers 170 may contact the upper surfaces of the metal-semiconductor layers 155. The contact insulating layers 170 may be spaced apart from the end portions of the source/drain regions 150 in the Y direction to an outside of the source/drain regions 150.

The sidewalls of the contact insulating layers 170 may have a slope or a curvature along shapes of the gate spacer layers 164. In the drawings, the side surfaces of the contact insulating layers 170 that are in contact with the contact plugs 180 are illustrated as being perpendicular to the upper surface of the substrate 101, but the present disclosure is not limited thereto. The contact insulating layers 170 may include an insulating material, for example, silicon oxide, silicon oxynitride, or silicon nitride. In embodiments, the contact insulating layers 170 may be formed of an air gap.

As illustrated in FIG. 2B, the sidewall insulating layers 170R may be on the outer first surfaces of the source/drain regions 150 located outside in the Y direction, among the first surfaces of the source/drain regions 150. The sidewall insulating layers 170R may be bent and extended from the outer first surfaces onto the device isolation layer 110 adjacent to the source/drain regions 150. The sidewall insulating layers 170R may be layers formed together with the contact insulating layers 170 on the outer surfaces of the source/drain regions 150, and may remain without being removed. Therefore, the sidewall insulating layers 170R may be made of the same material as the contact insulating layers 170, and may be located to overlap the source/drain regions 150, when viewed in a plan view. A thickness, a shape, and an arrangement of the sidewall insulating layers 170R contacting the source/drain regions 150 and the device isolation layer 110 may vary according to different example embodiments.

The interlayer insulating layer 190 may be on the substrate 101 and the device isolation layer 110 outside of the contact insulating layers 170, and may extend to upper portions of the gate structures 160 and the contact plugs 180, not illustrated. The interlayer insulating layer 190 may include, for example, at least one of oxide, nitride, or oxynitride, and may include a low dielectric constant material. In some example embodiments, the interlayer insulating layer 190 may be formed of a plurality of layers formed at different operations according to a manufacturing process.

Figure 3:
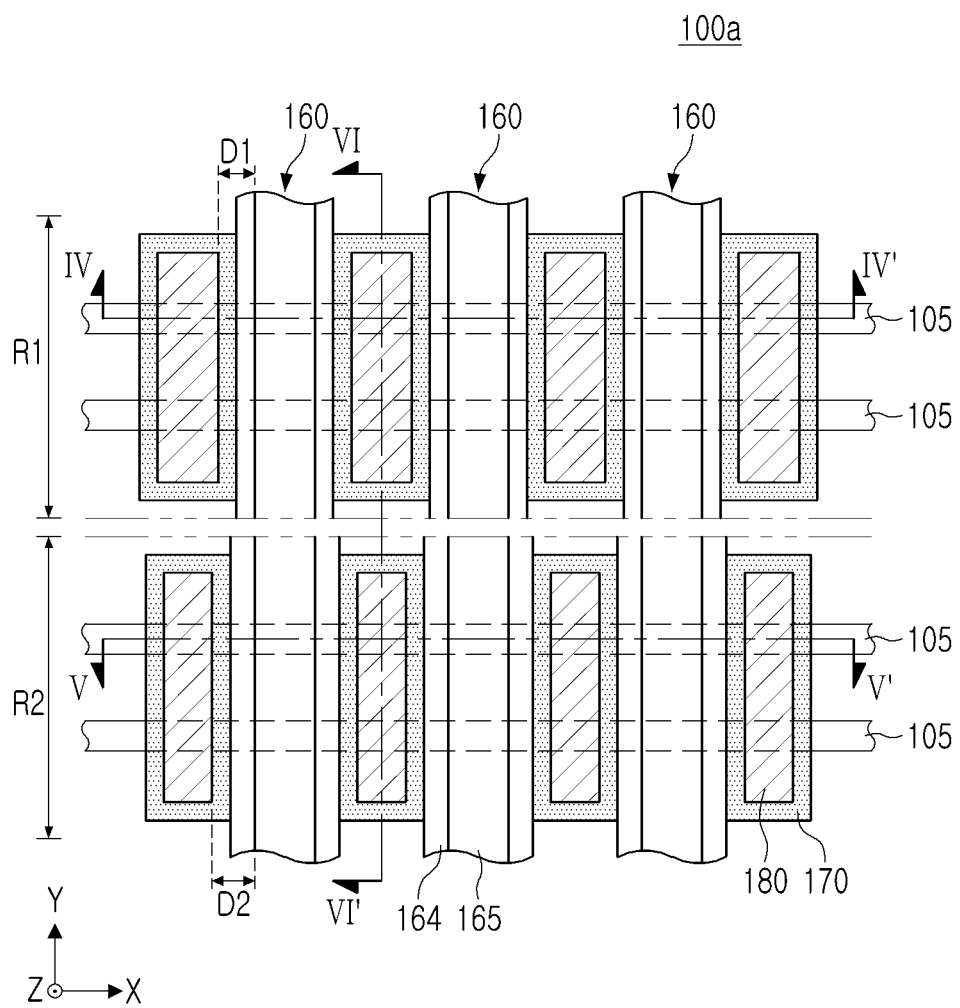
FIG. 3 is a plan view illustrating a semiconductor device according to some example embodiments.

FIG. 3 is a plan view illustrating a semiconductor device according to some example embodiments.

Figure 4A:
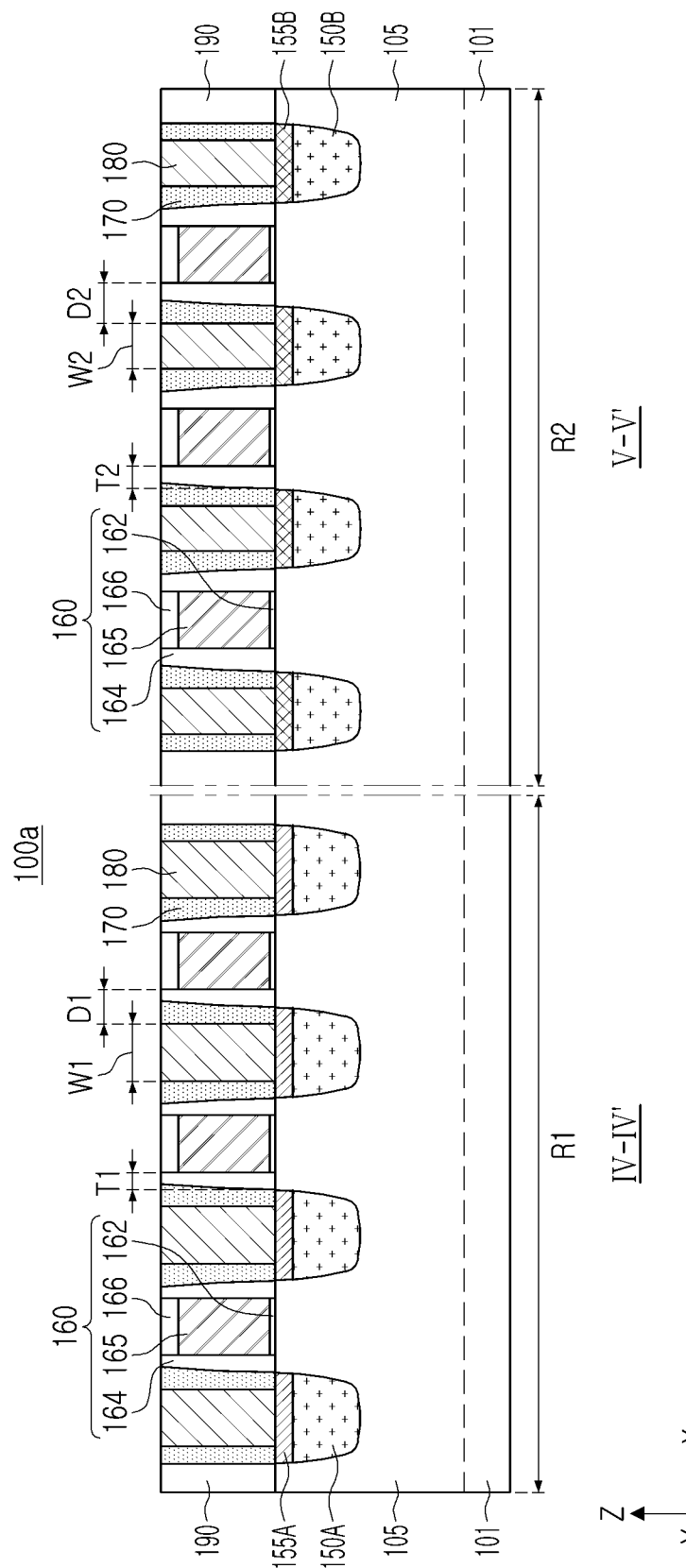
FIGS. 4A and 4B are cross-sectional views illustrating a semiconductor device according to some example embodiments.
Figure 4B:
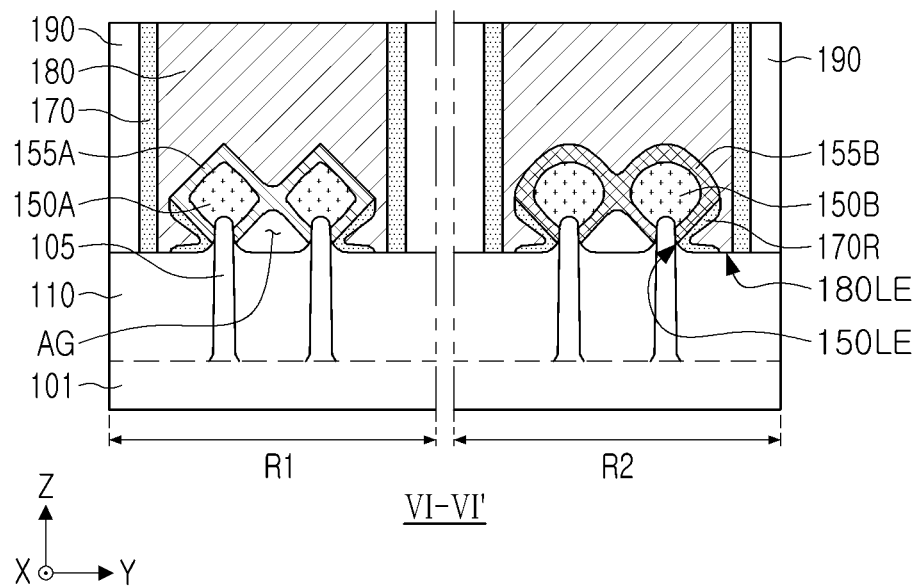

FIGS. 4A and 4B are cross-sectional views illustrating a semiconductor device according to some example embodiments. FIG. 4A illustrates a cross-sectional view of the semiconductor device of FIG. 3, taken along lines IV-IV' and V-V', and FIG. 4B illustrates a cross-sectional view of the semiconductor device of FIG. 3 taken along line VI-VI'. For convenience of description, only main components of the semiconductor device may be illustrated in FIGS. 3 to 4B.

Referring to FIGS. 3 to 4B, a semiconductor device 100a may include a substrate 101 having first and second regions R1 and R2, active regions 105, an device isolation layer 110, first and second source/drain regions 150A and 150B, gate structures 160, contact insulating layers 170, contact plugs 180, and an interlayer insulating layer 190. The semiconductor device 100a may include transistors arranged around the active regions 105 and the gate structures 160, intersecting each other. For example, PMOS transistors may be disposed in the first region R1. NMOS transistors may be disposed in the second region R2. Hereinafter, portions of the description of FIGS. 3 to 4B that are overlapping the description above with reference to FIGS. 1 to 2C may be omitted.

The substrate 101 and the active regions 105 may include impurities of different conductivity types in the first and second regions R1 and R2. The first and second source/drain regions 150A and 150B may include different materials. In particular, first and second metal-semiconductor layers 155A and 155B of the first and second source/drain regions 150A and 150B may be made of different materials in the first and second regions R1 and R2, respectively. For example, the first metal-semiconductor layers 155A of the first region R1 may include nickel silicide (NiSi), and the second metal-semiconductor layers 155B of the second region R2 may be titanium silicide (TiSi). In some example embodiments, gate electrode layers 165 may also include different metal materials in the first and second regions R1 and R2, respectively.

A first distance D1 between the gate electrode layers 165 and the contact plugs 180 in the first region R1 in the X direction may be shorter than a second distance D2 between the gate electrode layers 165 and the contact plugs 180 in the second region R2 in the X direction. This may be to optimize parasitic capacitance between the contact plugs 180 and the gate electrode layers 165 in transistors having different conductivity types.

In particular, in this and other example embodiments, thicknesses of the contact insulating layers 170 in the X direction may be substantially constant in the first and second regions R1 and R2, and thicknesses of the gate spacer layers 164 may be different from each other. For example, the gate spacer layers 164 may have a first thickness T1 in the first region R1, and may have a second thickness T2 in the second region R2, that is thicker or greater than the first thickness T1. Hereinafter, the distance, the thickness, or the width may refer to an average value or a value on the same height or level. In some example embodiments, the gate spacer layer 164 in the first region R1 may include a first layer and the gate spacer layer 164 in the second region R2 may include the first layer and a second layer formed on the first layer. The contact plugs 180 may have a first width W1 in the first region R1 in the X direction, and may have a second width W2 in the second region R2 in the X direction, narrower than the first width W1, but the present disclosure is not limited thereto.

Figure 5:
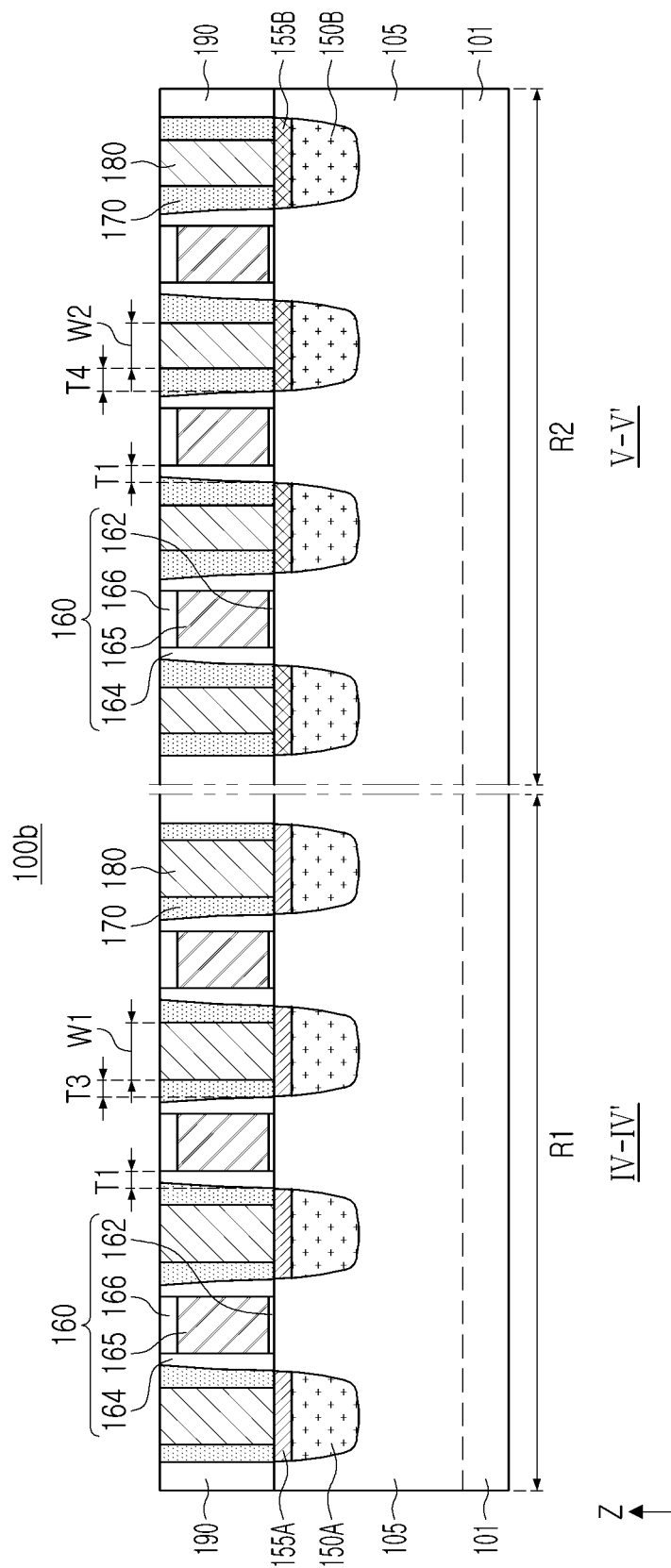
FIG. 5 is a cross-sectional view illustrating a semiconductor device according to some example embodiments.

FIG. 5 is a cross-sectional view illustrating a semiconductor device according to some example embodiments. FIG. 5 illustrates regions corresponding to the regions of FIG. 4A.

Referring to FIG. 5, in a semiconductor device 100b, thicknesses of gate spacer layers 164 in the X direction may be substantially constant in first and second regions R1 and R2, and contact insulating layers 170 may have different thicknesses. For example, the contact insulating layers 170 may have a third thickness T3 in the first region R1 in the X direction, and may have a fourth thickness T4 in the second region R2 in the X direction that is thicker than or greater than the third thickness T3. Contact plugs 180 may have a first width W1 in the first region R1 in the X direction, and may have a second width W2 in the second region R2 in the X direction, narrower than or less than the first width W1. However, the present disclosure is not limited thereto, and in some example embodiments the widths may be substantially the same.

In the semiconductor device 100b, the distance between gate electrode layers 165 and the contact plugs 180 in the first region R1 in the X direction may be shorter than the distance between the gate electrode layers 165 and the contact plugs 180 in the second region R2 in the X direction.

Figure 6A:
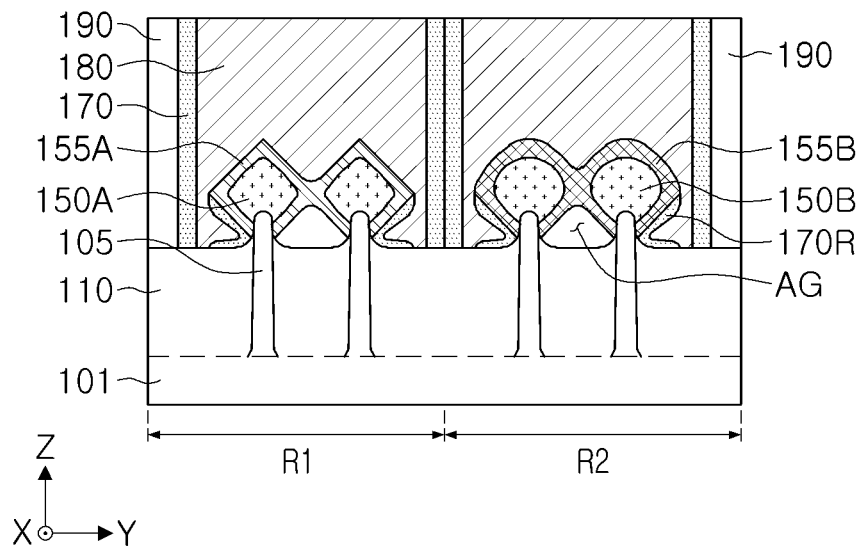
FIGS. 6A and 6B are cross-sectional views illustrating a semiconductor device according to some example embodiments.
Figure 6B:
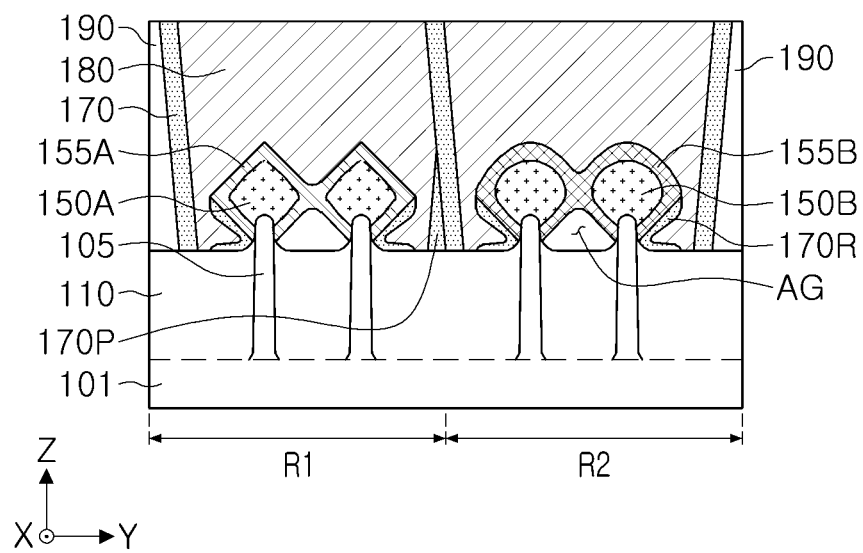

FIGS. 6A and 6B are cross-sectional views illustrating a semiconductor device according to some example embodiments. FIGS. 6A and 6B illustrate cross-sectional views along the Y direction at a boundary of first and second regions R1 and R2.

Referring to FIG. 6A, in a semiconductor device 100c, portions of contact insulating layers 170 may be in contact with each other at a boundary between first and second regions R1 and R2. The contact insulating layer 170 in an end portion of the first region R1 and the contact insulating layer 170 in an end portion of the second region R2 may be in contact with each other. In this case, a thickness of any one of the contact insulating layer 170 in the end portion of the first region R1 and the contact insulating layer 170 in the end portion of the second region R2 may be thinner than or less than a thickness of the other one.

Referring to FIG. 6B, in a semiconductor device 100d, contact plugs 180 may have side surfaces having a slope to decrease a width of the contact plugs 180 from an upper portion of the contact plugs 180 toward a substrate 101. At a boundary between first and second regions R1 and R2, contact insulating layer 170 in an end portion of the first region R1 may be in contact with contact insulating layer 170 in an end portion of the second region R2, and may be a partial structure or a partially remained structure. Such a structure may be formed by partially removing the contact insulating layer 170 previously formed in the first region R1, at a time of forming the contact insulating layer 170 in the second region R2. A height and a shape of the contact insulating layer 170 remained in the first region R1 may be different in different example embodiments.

Figure 7:
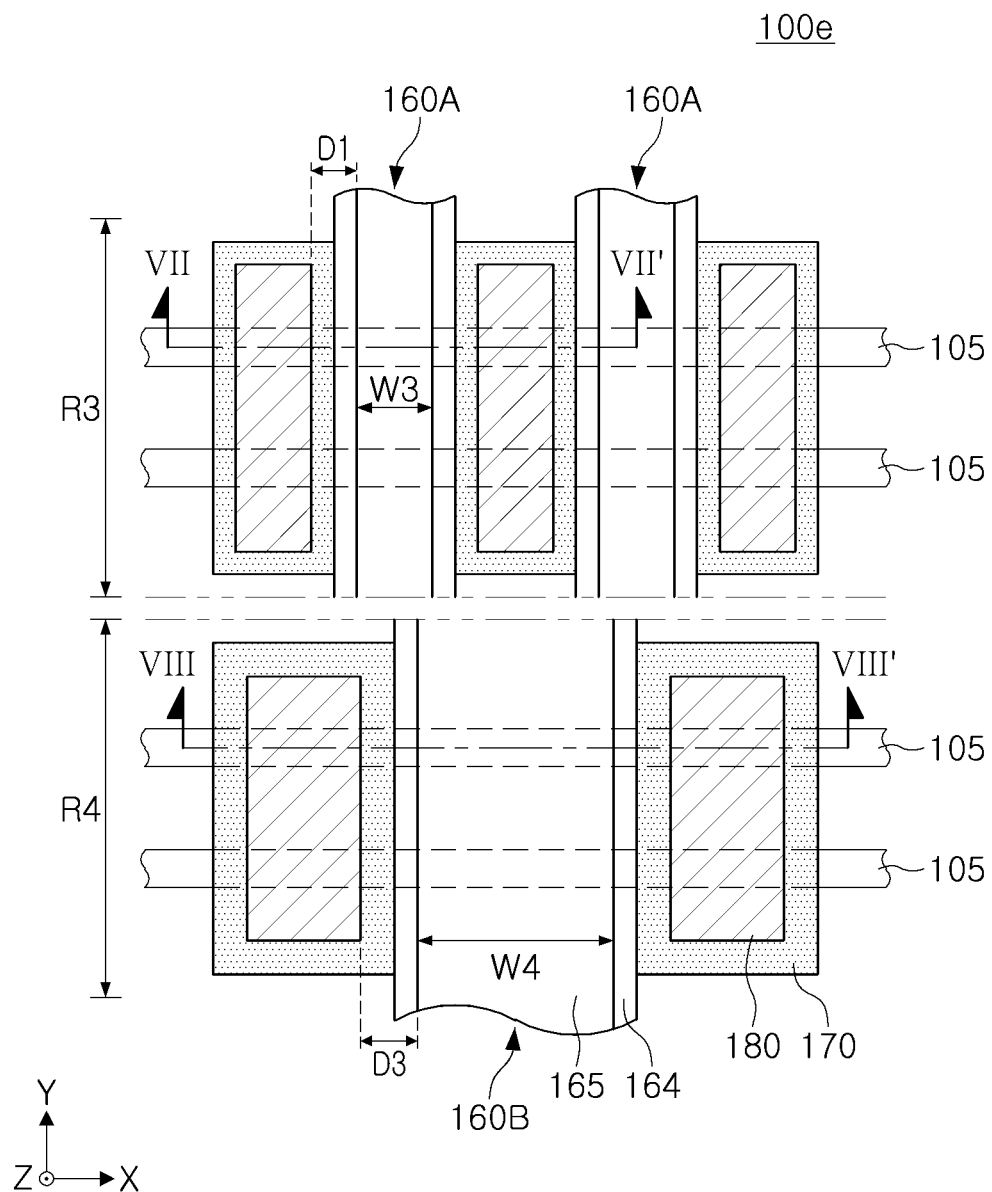
FIG. 7 is a plan view illustrating a semiconductor device according to some example embodiments.

FIG. 7 is a plan view illustrating a semiconductor device according to some example embodiments.

Figure 8:
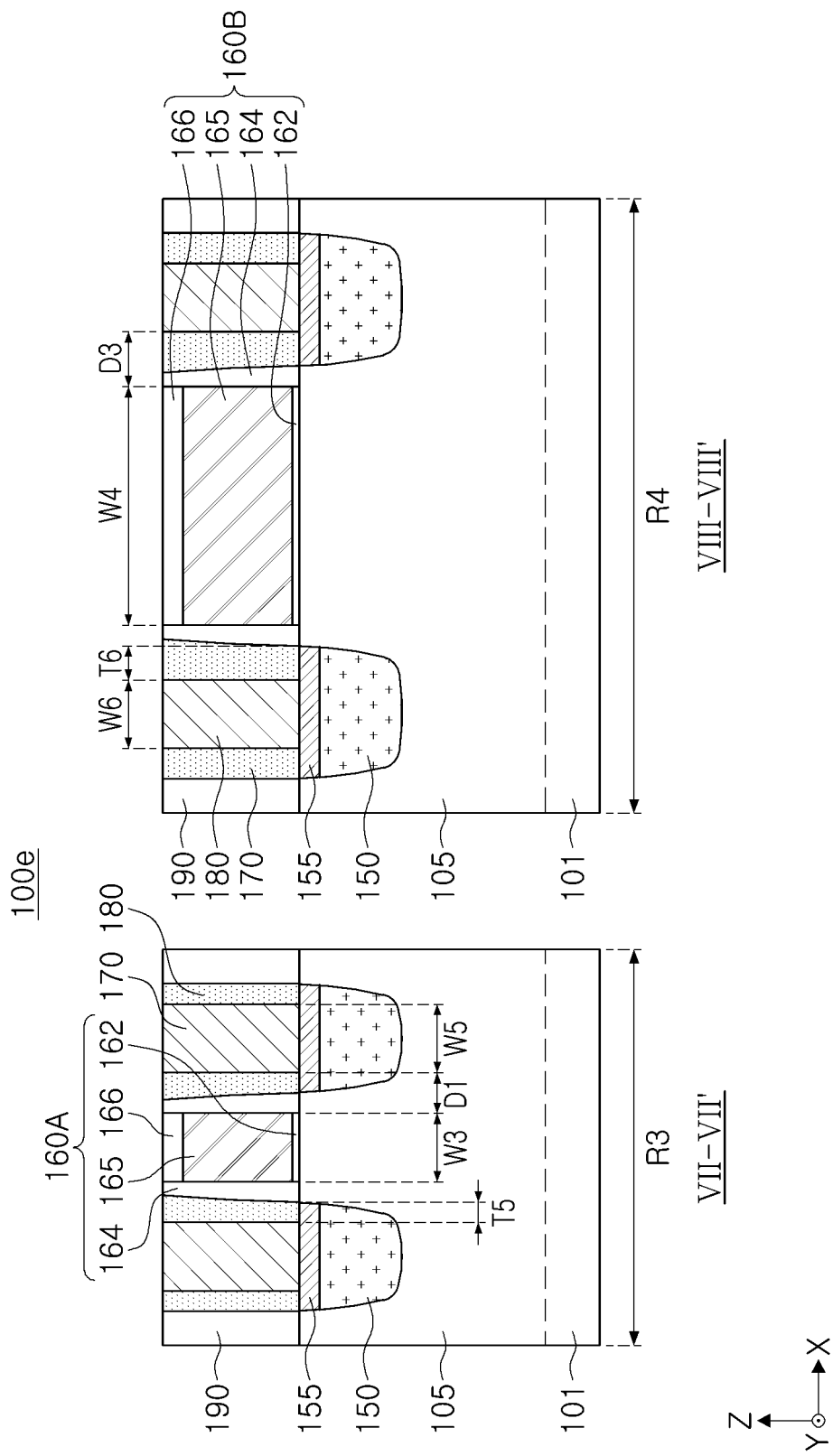
FIG. 8 is a cross-sectional view illustrating a semiconductor device according to some example embodiments.

FIG. 8 is a cross-sectional view illustrating a semiconductor device according to some example embodiments. FIG. 8 illustrates cross-sectional views of the semiconductor device of FIG. 7 taken along lines VII-VII' and VIII-VIII'.

Referring to FIGS. 7 and 8, a semiconductor device 100e may include a substrate 101 having third and fourth regions R3 and R4, active regions 105, an device isolation layer 110, source/drain regions 150, first and second gate structures 160A and 160B, contact insulating layers 170, contact plugs 180, and an interlayer insulating layer 190. The semiconductor device 100e may include transistors arranged around the active regions 105 and the first and second gate structures 160A and 160B, intersecting each other. For example, the transistors in the third and fourth regions R3 and R4 may have different pitches, thus may have different lengths of channel regions. In this case, the transistors in the third and fourth regions R3 and R4 may be transistors driven under different threshold voltages.

Gate electrode layers 165 may have a third width W3 in the third region R3 in the X direction, and may have a fourth width W4 in the fourth region R4 in the X direction, wider than or greater than the third width W3. Thicknesses of the contact insulating layers 170 may be different in the third and fourth regions R3 and R4. For example, the contact insulating layers 170 may have a fifth thickness T5 in the third region R3 and may have a sixth thickness T6 in the fourth region R4, thicker than or greater than the fifth thickness T5. The contact plugs 180 may have a fifth width W5 in the third region R3 in the X direction, and may have a sixth width W6 in the fourth region R4 in the X direction, wider than the fifth width W5, but the present disclosure is not limited thereto. Thicknesses of gate spacer layers 164 in the X direction may be substantially the same in the third and fourth regions R3 and R4, but the present disclosure is not limited thereto. Therefore, in the semiconductor device 100e, a first distance D1 between the gate electrode layers 165 and the contact plugs 180 in the third region R3 in the X direction may be shorter than a third distance D3 between the gate electrode layers 165 and the contact plugs 180 in the fourth region R4 in the X direction.

Figure 9A:
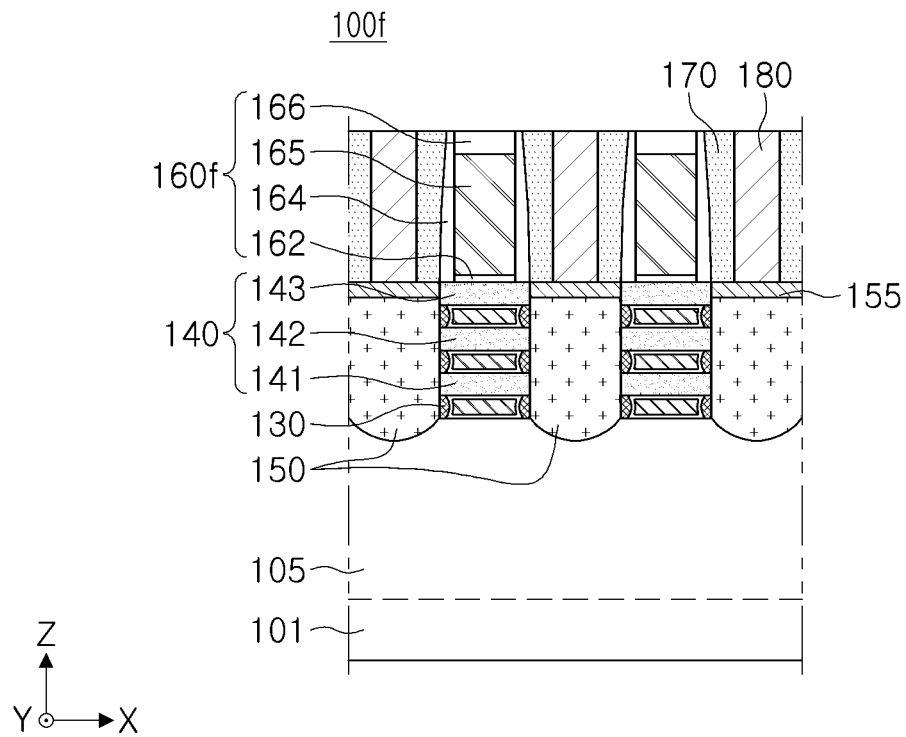
FIGS. 9A to 9C are cross-sectional views of a semiconductor device according to some example embodiments.
Figure 9B:
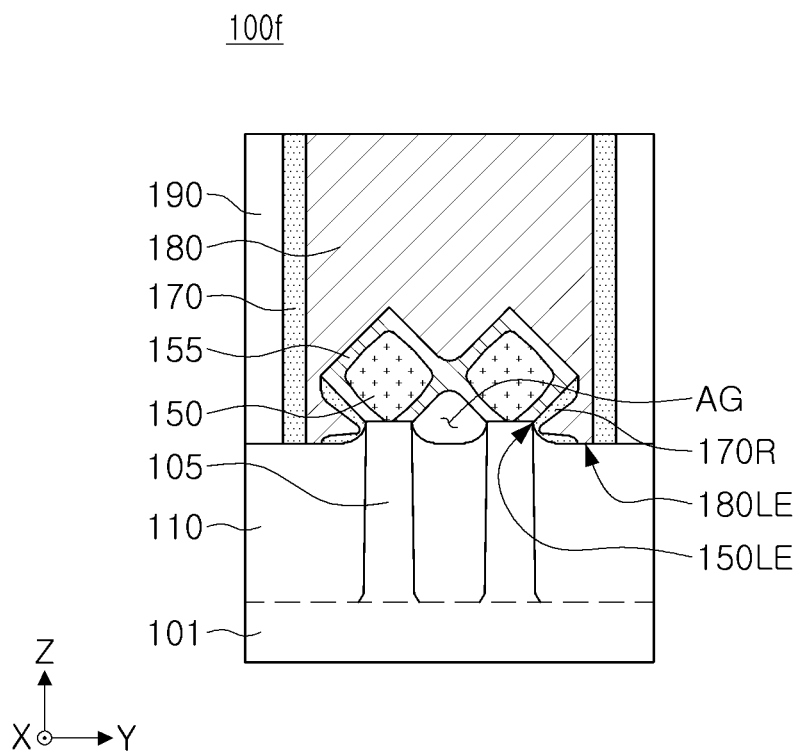
Figure 9C:
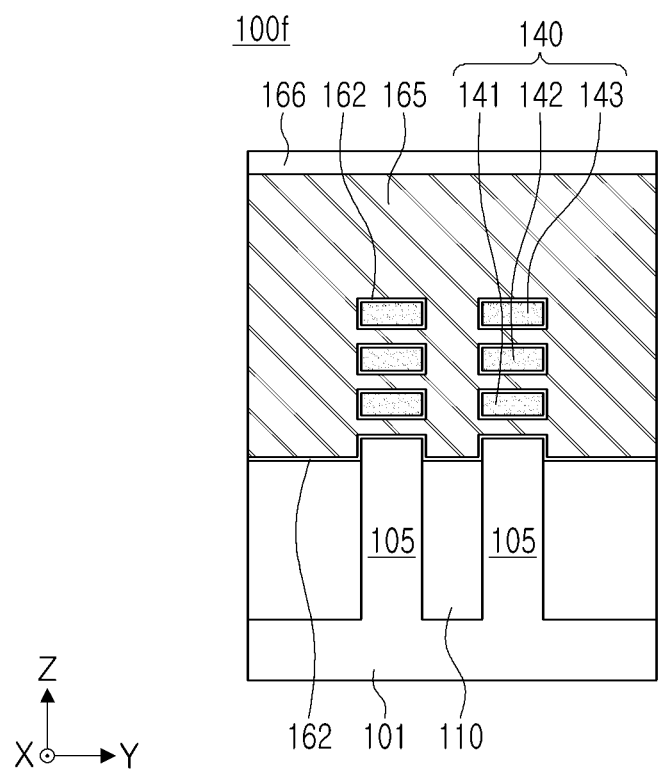

FIGS. 9A to 9C are cross-sectional views of a semiconductor device according to some example embodiments. FIGS. 9A to 9C illustrate regions corresponding to FIGS. 2A to 2C.

Referring to FIGS. 9A to 9C, a semiconductor device 100f may include a substrate 101, active regions 105 on the substrate 101, channel structures 140 including a plurality of channel layers 141, 142, and 143 arranged on the active regions 105 to be spaced apart from and perpendicular to each other, source/drain regions 150 contacting the plurality of channel layers 141, 142, and 143, gate structures 160f intersecting and extending the active regions 105, contact insulating layers 170, and contact plugs 180 connected to the source/drain regions 150. The semiconductor device 100f may include transistors having a gate-all-around structure, in which the gate structures 160f are between the active regions 105 and the channel structures 140 and between a plurality of nano-sheet-shaped channel layers 141, 142, and 143 of the channel structures 140. The semiconductor device 100f may include transistors of a multi bridge channel FET (MBCFET™) structure having the channel structures 140, the source/drain regions 150, and the gate structures 160f.

The channel structure 140 may include first to third channel layers 141, 142, and 143, which are at least two channel layers on the active regions 105 arranged to be spaced apart from each other, in a direction perpendicular to upper surfaces of the active regions 105, for example, in a Z direction. The first to third channel layers 141, 142, and 143 may be connected to the source/drain regions 150 and may be spaced apart from the upper surfaces of the active regions 105. The first to third channel layers 141, 142, and 143 may have the same or similar width as the active regions 105 in the Y direction, and may have the same or similar width as the gate structures 160f in the X direction. According to some example embodiments, the first to third channel layers 141, 142, and 143 may have reduced widths such that side surfaces thereof are below the gate structures 160f in the X direction.

The first to third channel layers 141, 142, and 143 may be formed of a semiconductor material, and may include, for example, at least one of silicon (Si), silicon germanium (SiGe), or germanium (Ge). The first to third channel layers 141, 142, and 143 may, for example, be made of the same material as the substrate 101. The number and a shape of the channel layers 141, 142, and 143 constituting one of the channel structures 140 may vary in different example embodiments. For example, a channel layer may be further located in an upper portion of the active regions 105 below the gate electrode layers 165.

The gate structures 160f may intersect the active regions 105 and the channel structures 140 on the active regions 105 and the channel structures 140, and the gate structures 160f may extend in one direction, for example, the Y direction. Channel regions of the transistors may be formed in the active regions 105 and the channel structures 140, intersecting the gate structures 160f. Each gate structure 160f may include a gate electrode layer 165, a gate insulating layer 162 between the gate electrode layer 165 and the plurality of channel layers 141, 142, and 143, gate spacer layers 164 on the gate electrode layer 165, and a gate capping layer 166 on an upper surface of the gate electrode layer 165.

The gate insulating layer 162 may be between the active region 105 and the gate electrode layer 165, may be between the channel structure 140 and the gate electrode layer 165, and may cover at least a portion of surfaces of the gate electrode layer 165. For example, the gate insulating layer 162 may surround surfaces of the gate electrode layer 165, and in some example may surround entire surfaces of the gate electrode layer 165, except for an uppermost surface of the gate electrode layer 165.

The gate electrode layer 165 may fill a space or region between the channel layers 141, 142, and 143 on the active regions 105, and may extend to an upper portion of the channel structure 140. The gate electrode layer 165 may be spaced apart from the plurality of channel layers 141, 142, and 143 by the gate insulating layer 162.

Internal spacer layers 130 may be in parallel with the gate electrode layer 165 between the channel structures 140. The gate electrode layer 165 may be spaced apart from and electrically separated from the source/drain regions 150 by the internal spacer layers 130. The internal spacer layers 130 may have a shape in which a side surface facing the gate electrode layer 165 is convexly rounded toward the gate electrode layer 165 in a medial direction, but the present disclosure is not limited thereto. The internal spacer layers 130 may be formed of oxide, nitride, and oxynitride, and in particular, may be formed of a low dielectric constant film.

In some example embodiments, this transistor having an MBCFET$^{MT}$ structure may be additionally provided in a region of the semiconductor device described above with reference to FIGS. 1 to 8.

Figure 10A:
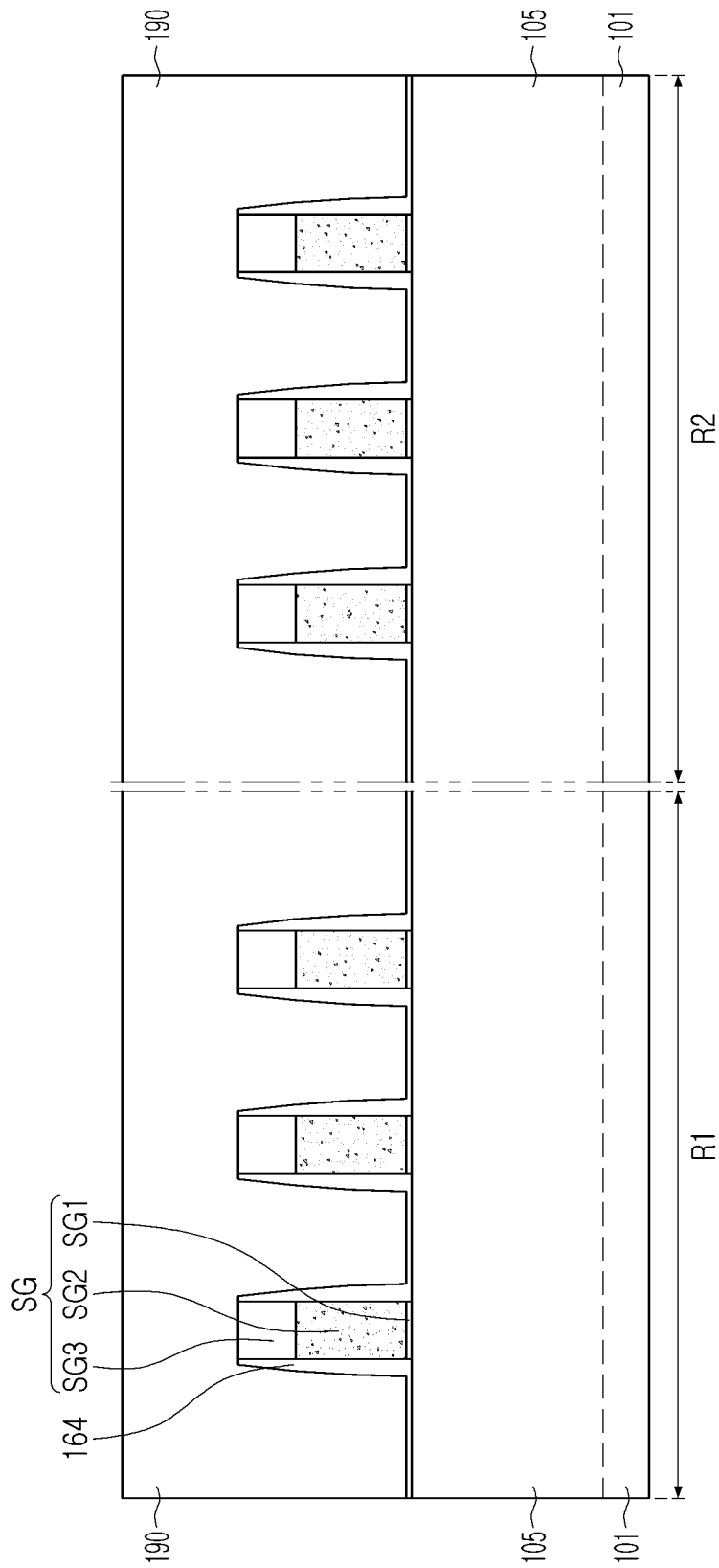
FIGS. 10A to 10K are view illustrating a method of manufacturing a semiconductor device according to some example embodiments.
Figure 10B:
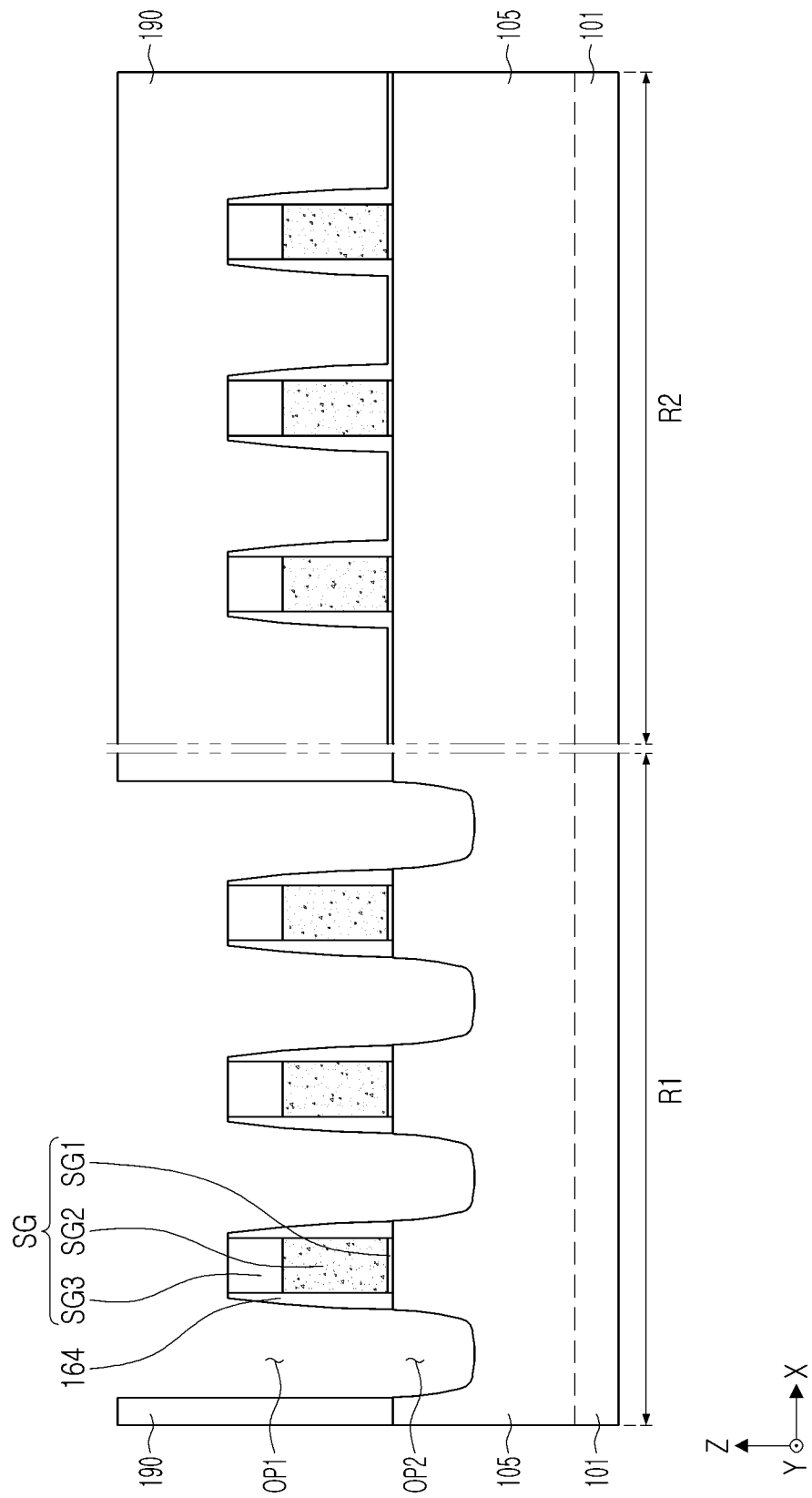
Figure 10C:
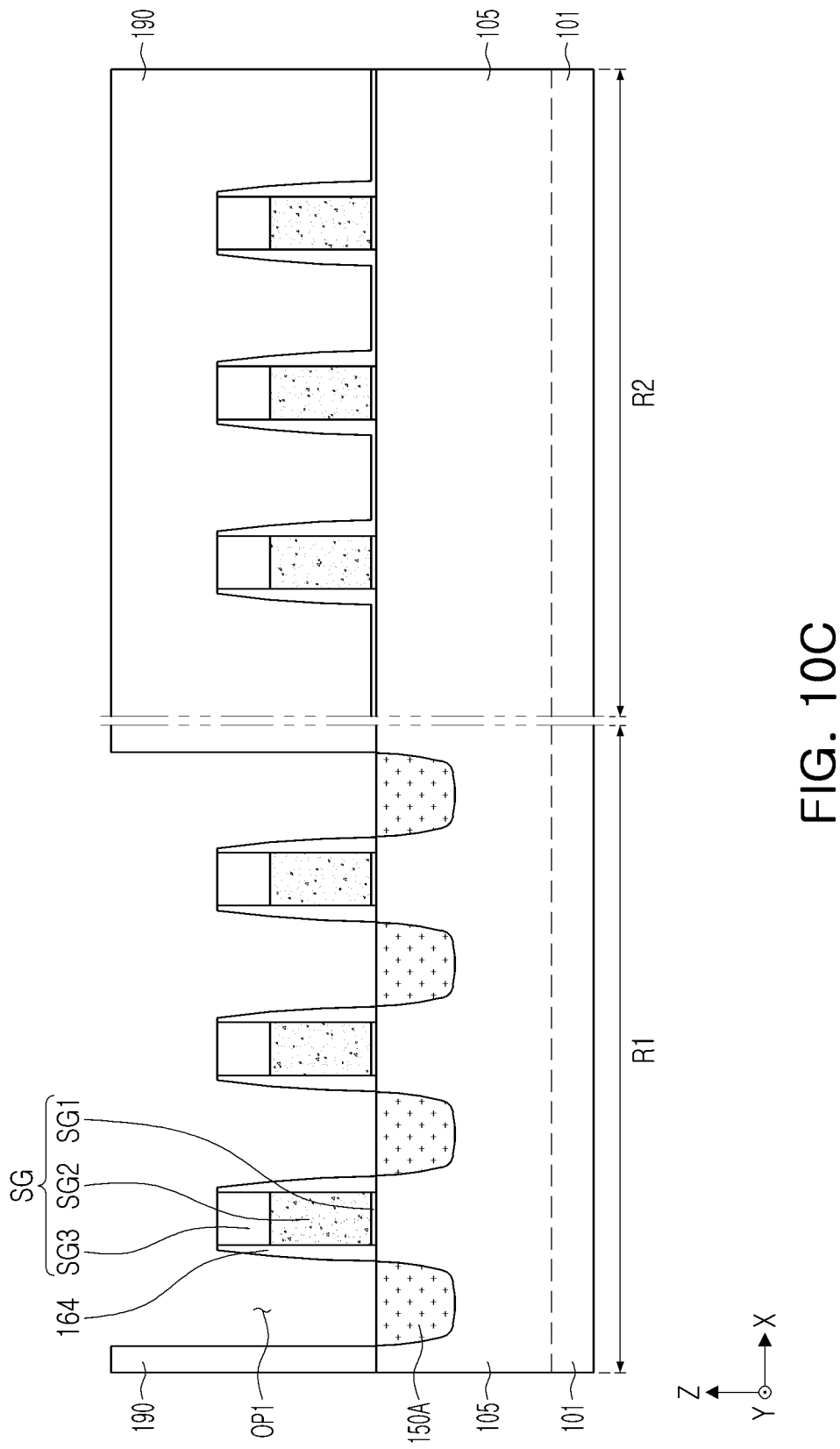
Figure 10D:
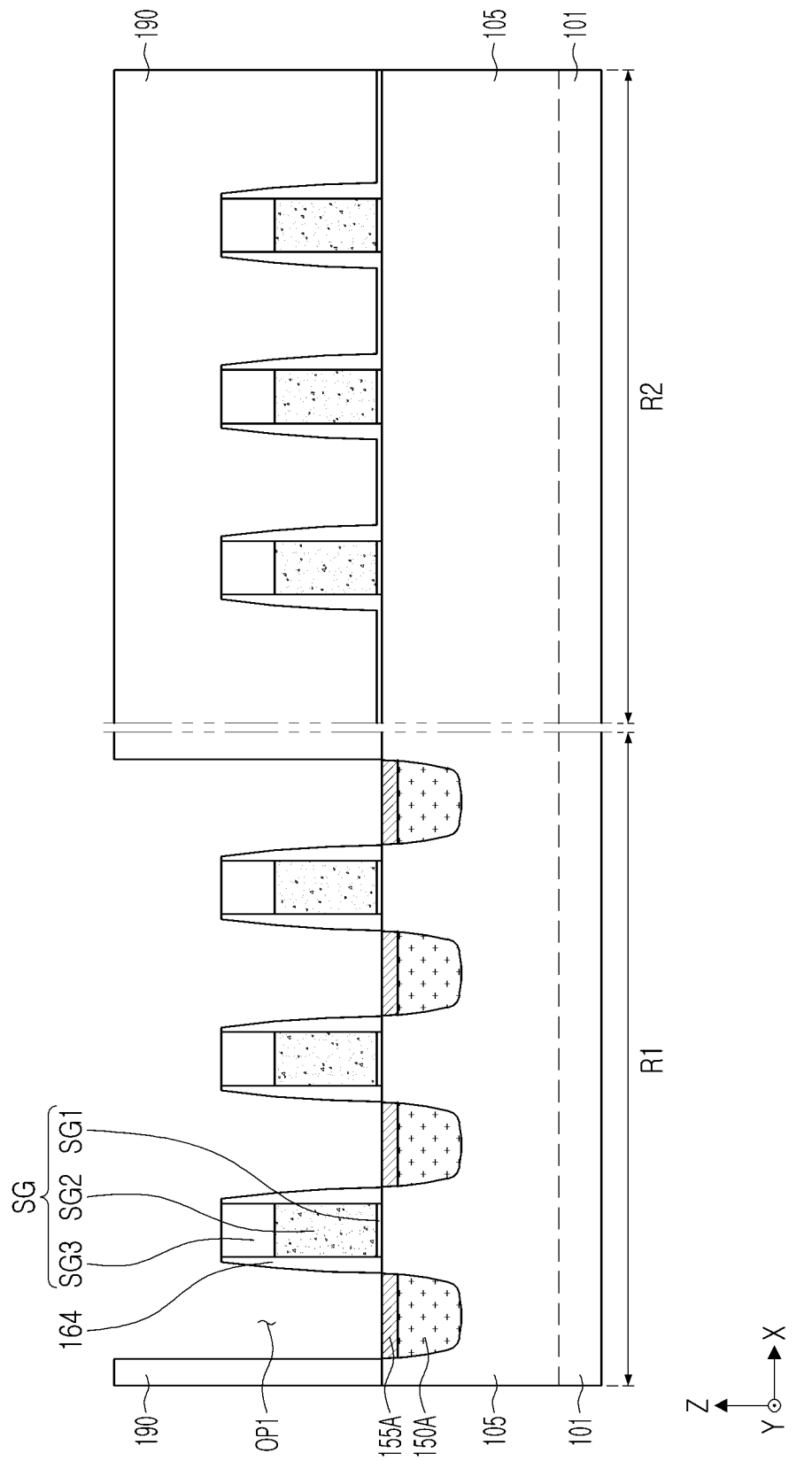
Figure 10E:
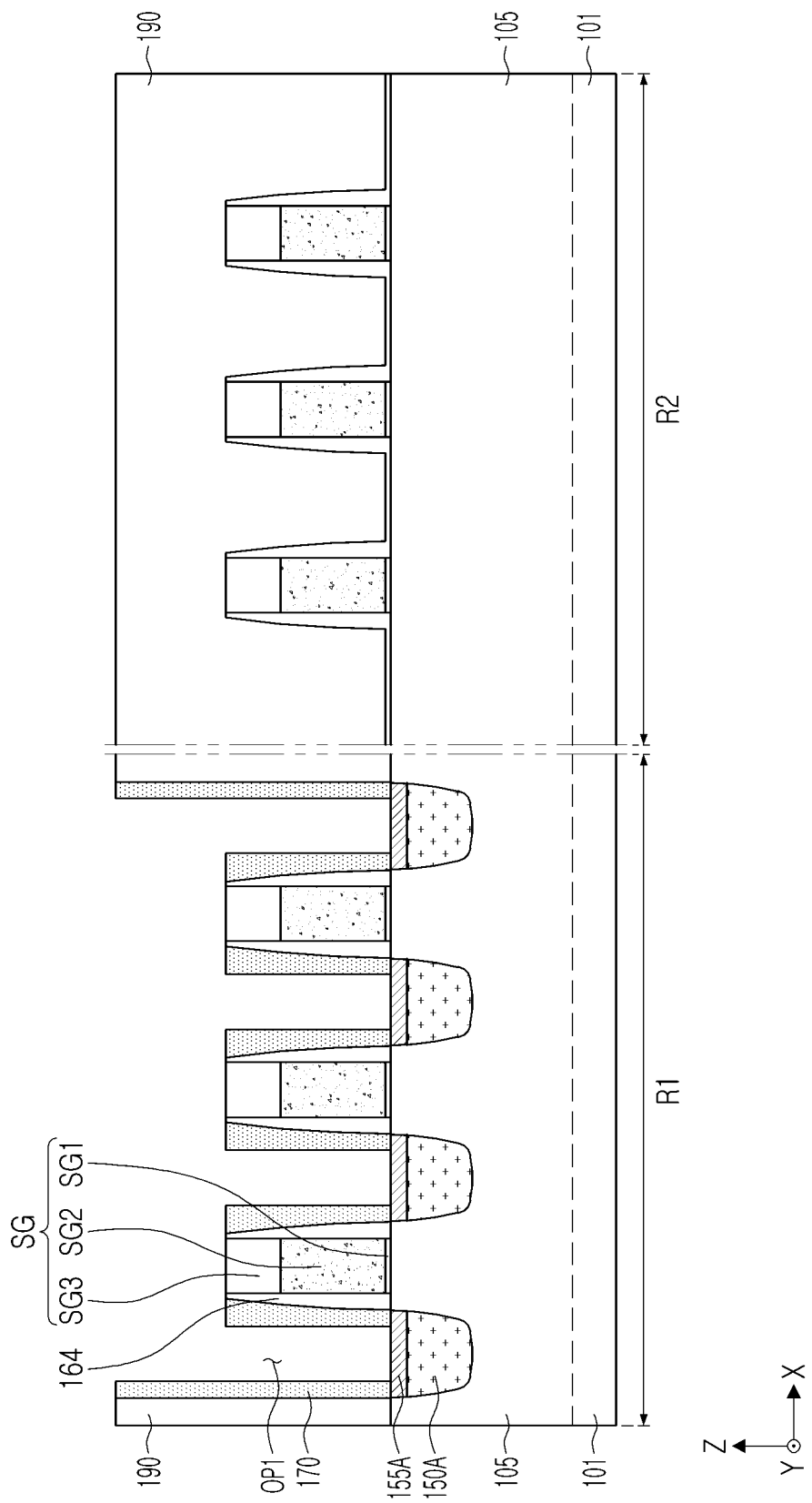
Figure 10F:
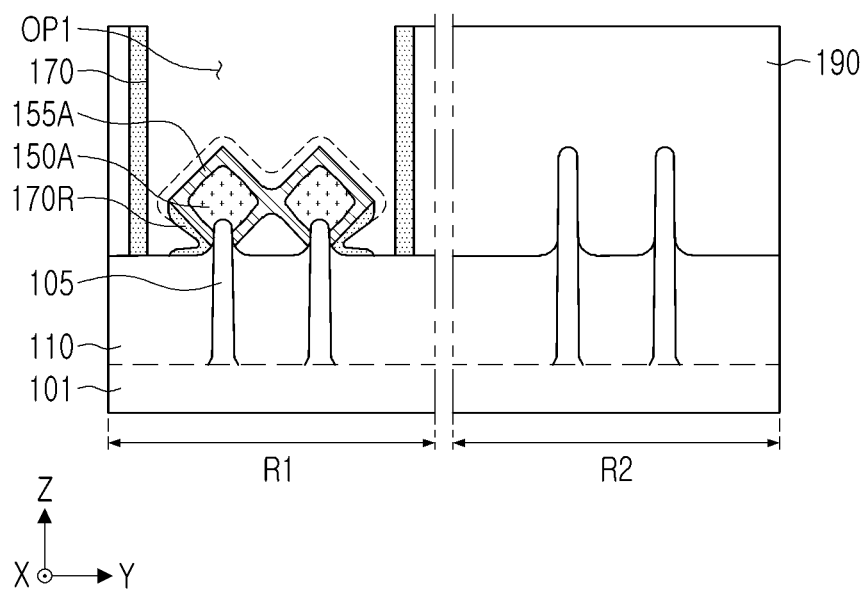

FIGS. 10A to 10K are view illustrating methods of manufacturing a semiconductor device according to some example embodiments. FIGS. 10A to 10K illustrate operations of an example embodiment of a method of manufacturing the semiconductor device of FIGS. 3 to 4B. FIGS. 10A to 10E and FIGS. 10G to 10K illustrate cross-sectional views corresponding to FIG. 4A, and FIG. 10F illustrates a cross-sectional view corresponding to FIG. 4B.

Referring to FIG. 10A, active regions 105 may be formed by patterning a substrate 101 and forming device isolation layer 110. Thereafter, sacrificial gate structures SG and gate spacer layers 164 may be formed.

First, active regions 105 may be formed by anisotropically etching a substrate 101 using a mask layer to form trench regions. The substrate 101 may include first and second regions R1 and R2, and the active regions 105 may include impurities of different conductivity types in the first and second regions R1 and R2. Since the trench regions have a relatively high aspect ratio, the width of the trench regions that may be narrower in a downward direction or that may narrow or decrease moving from an upper portion of the trench region toward the substrate 101, and the active regions 105 may have a shape narrowing in an upward direction. A device isolation layer 110 may be formed by filling the trench regions with an insulating material and then planarizing the filled trench regions along upper surfaces of the active regions 105.

Next, sacrificial gate structures SG may be formed on the active regions 105 to have a linear shape extending in the Y direction to intersect the active regions 105. The sacrificial gate structures SG may be formed in a region in which the gate structures 160 are arranged as illustrated in FIG. 4A by a subsequent process. The sacrificial gate structure SG may include first to third sacrificial gate layers SG1, SG2, and SG3. The first and second sacrificial gate layers SG1 and SG2 may be an insulating layer and a conductive layer, respectively, but the present disclosure is not limited thereto. The first and second sacrificial gate layers SG1 and SG2 may be provided as a single layer. For example, the first sacrificial gate layer SG1 may include silicon oxide, and the second sacrificial gate layer SG2 may include polysilicon. The third sacrificial gate layer SG3 may be used to pattern the first and second sacrificial gate layers SG1 and SG2, and may include silicon oxide and/or silicon nitride. A configuration of the sacrificial gate structure SG may be different in different example embodiments.

Gate spacer layers 164 may be formed on sidewalls of the sacrificial gate structure SG, and a portion of the gate spacer layers 164 may remain on the active regions 105. An interlayer insulating layer 190 covering the sacrificial gate structure SG and the substrate 101 may be formed on the sacrificial gate structure SG. A thickness of the interlayer insulating layer 190 may vary in different example embodiments. For example, an upper surface of the interlayer insulating layer 190 may be on the same height or a similar height as an upper surface of the sacrificial gate structure SG.

Referring to FIG. 10B, in the first region R1, the interlayer insulating layer 190 may be removed from both sides of the sacrificial gate structures SG to form first openings OP1, and the active region 105 exposed between the sacrificial gate structures SG may be recessed to form second openings OP2.

First, regions in which the first source/drain regions 150A, the contact insulating layers 170, and the contact plugs 180, illustrated in FIG. 4A, are to be arranged in the first region R1 may be exposed using separate mask layers. The exposed regions may be regions having a rectangular shape between which the sacrificial gate structures SG are interposed.

The interlayer insulating layer 190 and the active region 105 may be sequentially removed between the sacrificial gate structures SG using different etchants. For example, in some example embodiments, a region in which the first source/drain regions 150A are to be formed and a region in which the contact plugs 180 are to be formed may be simultaneously or sequentially etched and formed. Second openings OP2 may be formed between the gate spacer layers 164 so as to be extended from an outer side surface of the gate spacer layers 164 as illustrated in FIG. 10B, or may be formed to have a form extended to a lower portion of the gate spacer layers 164 or a lower portion of the sacrificial gate structures SG. Optionally, after the formation of the second openings OP2, a process of curing a surface of the recessed active region 105 may be performed by a separate process.

Referring to FIG. 10C, first source/drain regions 150A may be formed in the second openings OP2.

The first source/drain regions 150A may be, for example, an epitaxial layer formed by growing from the active region 105 using a selective epitaxial growth (SEG) process. In some example embodiments, the first source/drain regions 150A may include impurities by an in-situ doping process.

Referring to FIG. 10D, a portion of the first source/drain regions 150A may be metallized to form first metal-semiconductor layers 155A of the first source/drain regions 150A.

For example, when the first source/drain regions 150A include silicon (Si), the first metal-semiconductor layers 155A may be formed as a metal silicide layer by a metallization process. For example, the first metal-semiconductor layers 155A may include nickel silicide (NiSi).

Upper surfaces of the first metal-semiconductor layers 155A may be formed to be substantially coplanar with the upper surface of the active region 105, or may be formed to be higher than the upper surface of the active region 105, depending on a thickness of the first metal-semiconductor layers 155A to be formed. When the thickness of the first metal-semiconductor layers 155A is excessively thick, parasitic capacitance may increase. When the first metal-semiconductor layers 155A are formed to be lower than upper ends of the second openings OP2, stress in the first source/drain regions 150A may be reduced.

According to some example embodiments, the first metal-semiconductor layers 155A may be formed after the formation of the contact insulating layers 170, which will be described below with reference to FIG. 10E. In this case, since the sidewall insulating layers 170R (see FIG. 10F) are first formed, the first metal-semiconductor layers 155A may not be formed at least on outer first surfaces among the first surfaces, of the first source/drain regions 150A. When the first source/drain regions 150A are formed to be connected on the adjacent active regions 105, the first metal-semiconductor layers 155A may not be formed at least on inner first surfaces among the first surfaces, of the first source/drain regions 150A.

Referring to FIGS. 10E and 10F, contact insulating layers 170 may be formed on the side surfaces of the interlayer insulating layer 190 and the side surfaces of the gate spacer layers 164 in the first openings OP1.

The contact insulating layers 170 may have a liner shape and/or may conform to sidewalls of the side surfaces of the gate spacer layers 164 in the first openings OP1. The contact insulating layers 170 may be formed by forming an insulating material in the exposed regions with a uniform thickness, and partially removing the insulating material in the Z direction to expose the upper surfaces of the first source/drain regions 150A. The contact insulating layers 170 may include silicon nitride or silicon oxide. When the contact insulating layers 170 is made of a material having a relatively low dielectric constant, it may be advantageous in terms of parasitic capacitance. Although all of the side surfaces of the contact insulating layers 170 are illustrated to be vertical for convenience, the contact insulating layers 170 may have shapes along a profile of the gate spacer layers 164.

As illustrated in FIG. 10F, in a region between the sacrificial gate structures SG, the first opening OP1 may be formed such that the first source/drain regions 150A and the device isolation layer 110 are exposed, and the contact insulating layers 170 may be formed on the side surfaces of the interlayer insulating layers 190, respectively, spaced apart from both ends of the first source/drain regions 150A outwardly. In particular, as indicated by the dotted lines, the contact insulating layers 170 may be formed to surround all of the surfaces of the first source/drain regions 150A at first, and may be then removed to a predetermined thickness from the upward direction such that at least a portion of the contact insulating layers 170 remains on outer first surfaces in lower portions of the first source/drain regions 150A, to form sidewall insulating layers 170R. Also, the contact insulating layers 170 may be formed on the upper surface of the device isolation layer 110, and may be then removed in a region that does not overlap the first source/drain regions 150A. For example, according to this operation, the sidewall insulating layers 170R may be below the first source/drain regions 150A and on the upper surface of the device isolation layer 110, in a region overlapping the first source/drain regions 150A, when viewed in the plan view.

Figure 10G:
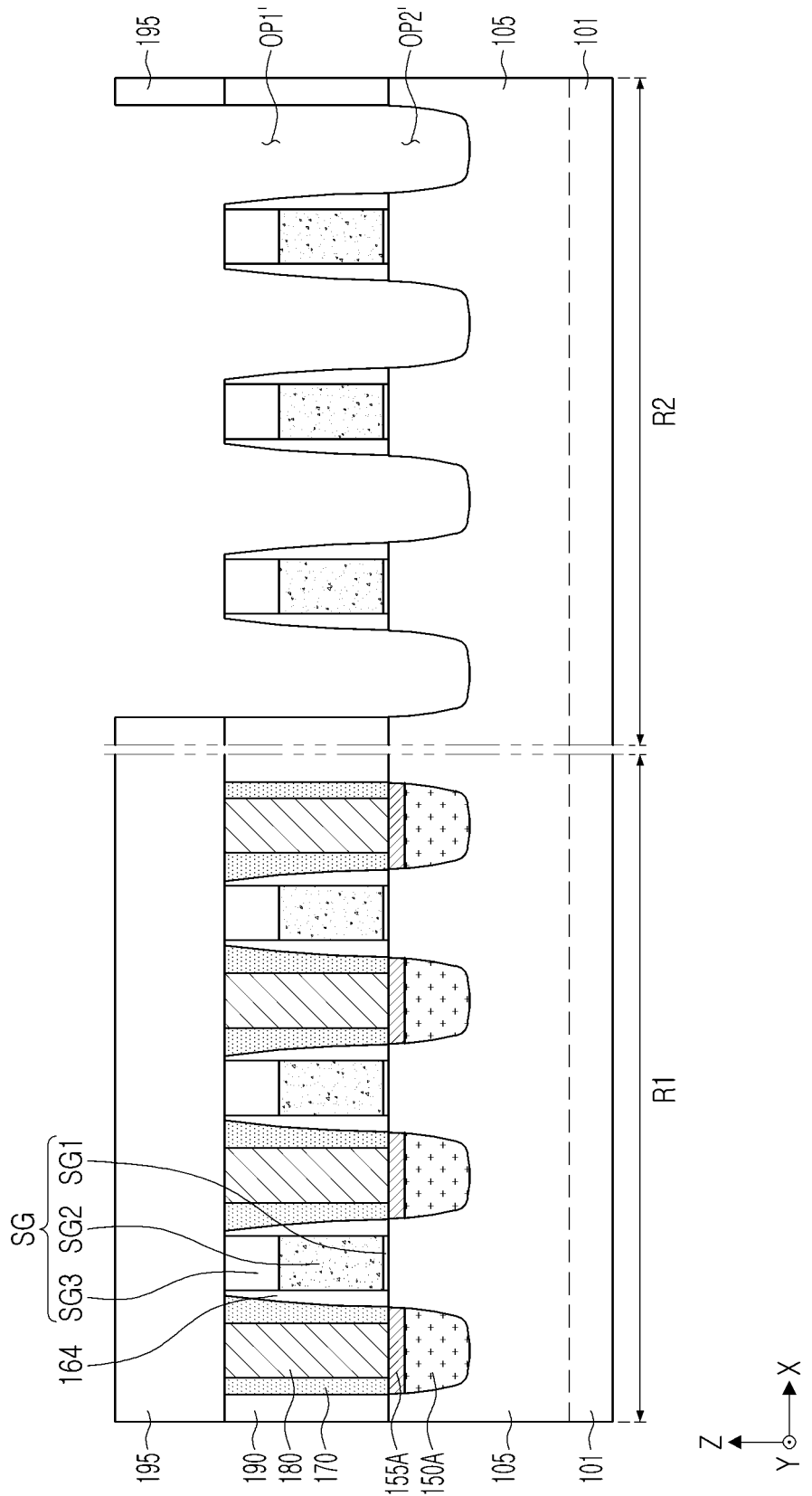

Referring to FIG. 10G, contact plugs 180 may be formed between the contact insulating layers 170 and on the first source/drain regions 150A, an upper interlayer insulating layer 195 may be then formed thereon, and first and second openings OP1' and OP2' may be formed in the second region R2.

First, contact plugs 180 may be formed by depositing a conductive material between the contact insulating layers 170 and performing a planarization operation. In the planarization operation, the third sacrificial gate layer SG3 may be used as a stopper layer. Next, an upper interlayer insulating layer 195 may be formed on the contact plugs 180.

As such, the contact plugs 180 may not be formed by etching the layers on the first source/drain regions 150A, but may be formed to fill the open region including the first opening OP1, and may be thus formed without recessing the first source/drain regions 150A. Therefore, since a contact area with the first source/drain regions 150A may be secured and a width in a lower end of the contact plugs 180 may be secured, a release in stress of the first source/drain regions 150A or an increase in contact resistance may be prevented. In addition, a size of the contact plugs 180 may be controlled to prevent occurrence of a defect in contact with the gate structures 160 formed subsequently.

First and second openings OP1' and OP2' may be formed in the same manner as described above with reference to FIG. 10B. In the second region R2, the interlayer insulating layers 190 may be removed from both of the sides of the sacrificial gate structures SG to form the first openings OP1', and may recess the active regions 105 exposed between the sacrificial gate structures SG to form the second openings OP2'.

Figure 10H:
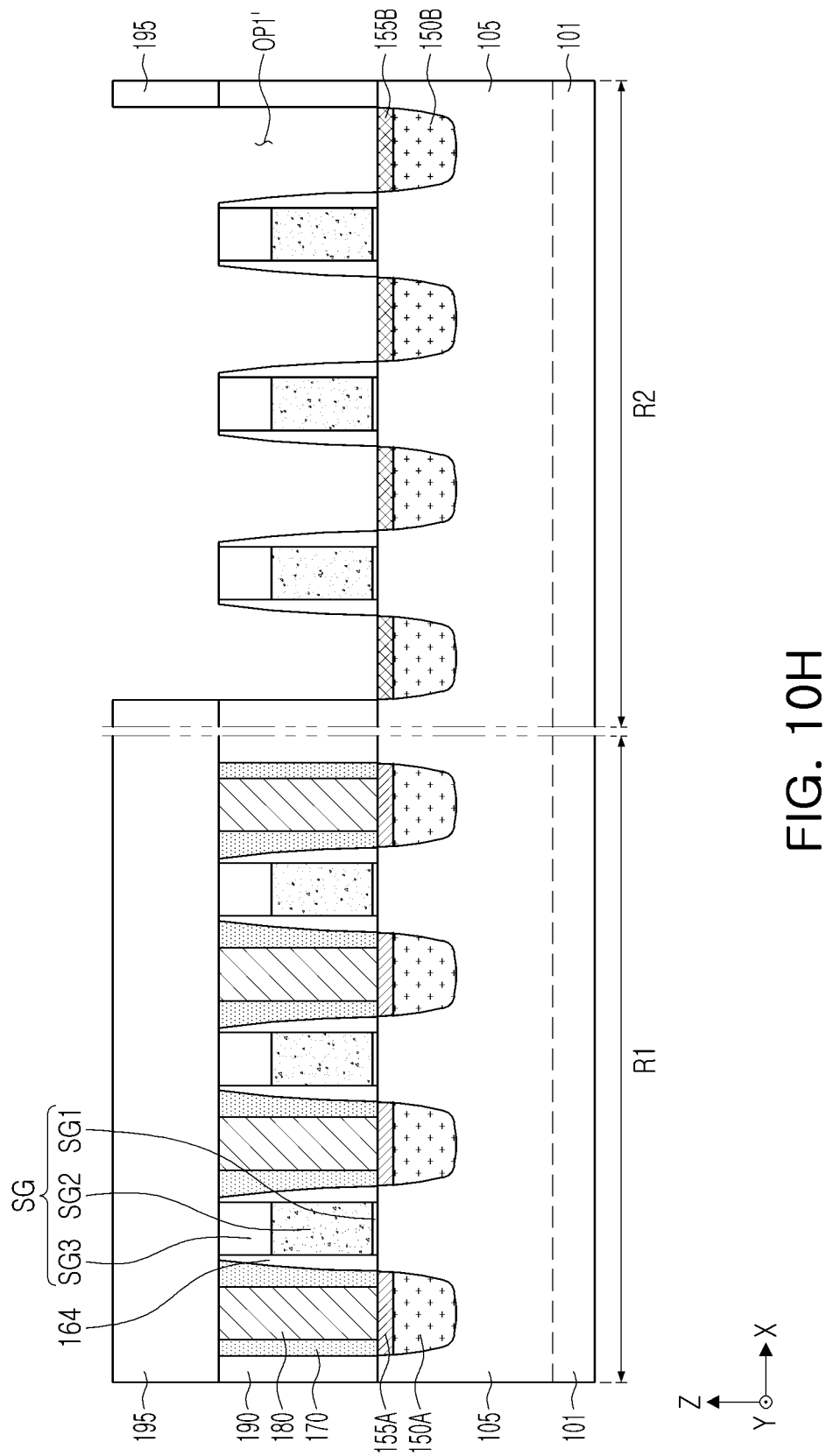

Referring to FIG. 10H, second source/drain regions 150B may be formed in the second openings OP2', and a portion of the second source/drain regions 150B may be metallized to form second metal-semiconductor layers 155B of the second source/drain regions 150B.

Second source/drain regions 150B and second metal-semiconductor layers 155B may be formed in the same manner as described above with reference to FIGS. 10C and 10D. The second source/drain regions 150B may include a material different from the first source/drain regions 150A, and the second metal-semiconductor layers 155B may also include a material different from the first metal-semiconductor layers 155A. For example, the second metal-semiconductor layers 155B may be formed to include titanium silicide (TiSi).

Figure 10I:
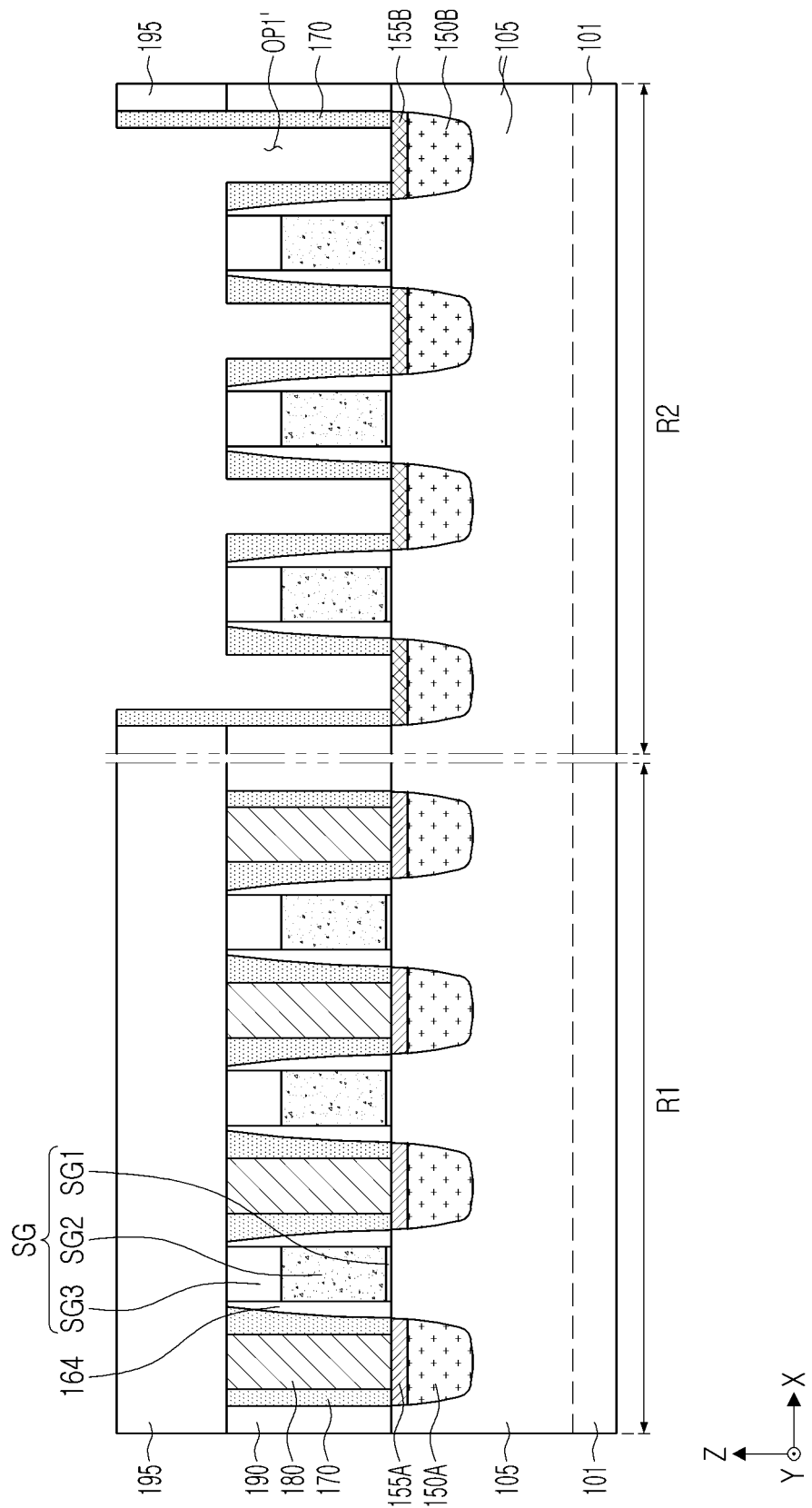

Referring to FIG. 10I, contact insulating layers 170 may be formed on the side surfaces of the interlayer insulating layer 190 and the side surfaces of the gate spacer layers 164 in the first openings OP1'.

The contact insulating layers 170 may be formed in the same manner as described above with reference to FIGS. 10E and 10F. As above, sidewall insulating layers 170R may be formed on the outer side surfaces of lower portions of the second source/drain regions 150B and on the device isolation layer 110, in the cross-sectional view along the Y direction.

Figure 10J:
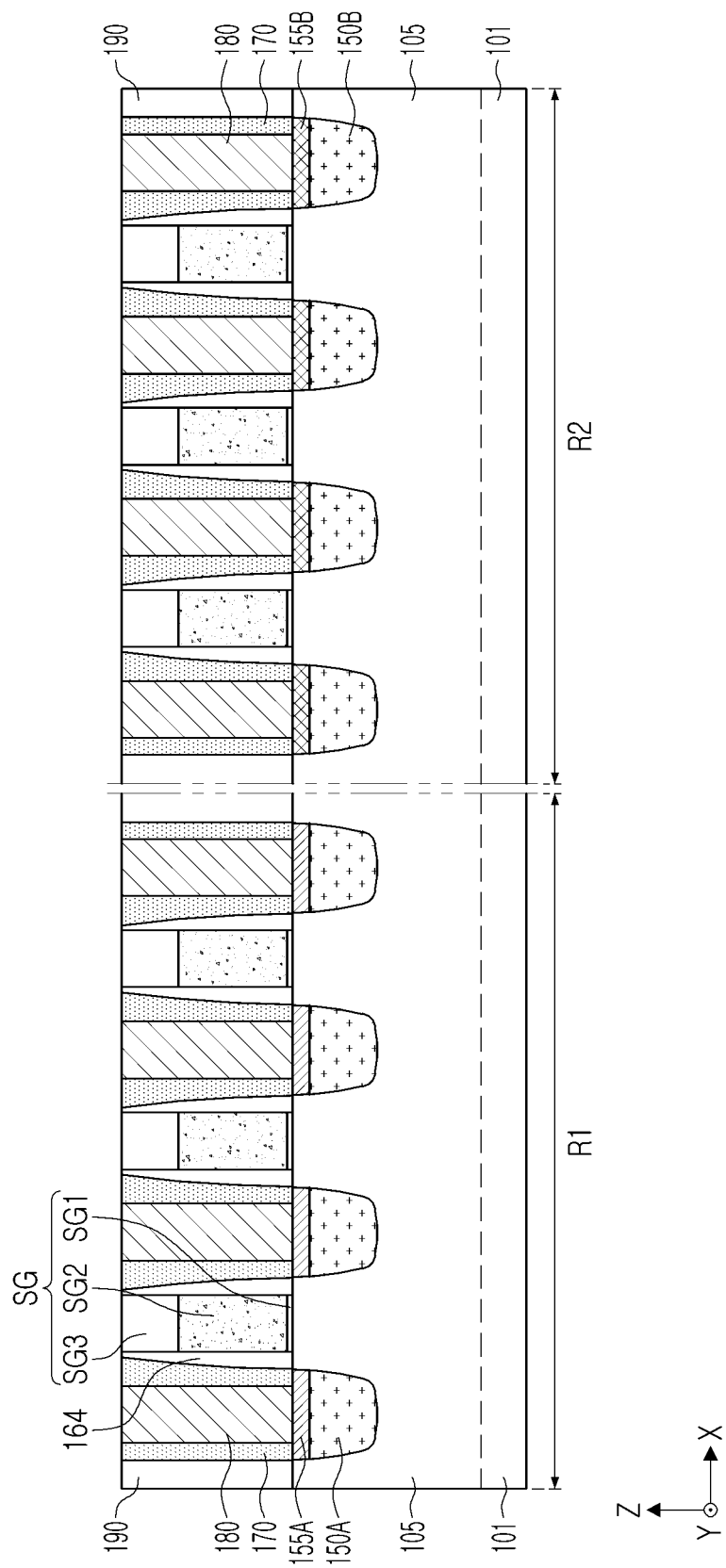

Referring to FIG. 10J, contact plugs 180 may be formed on the second source/drain regions 150B between the contact insulating layers 170, and a planarization operation may be then performed.

Contact plugs 180 may be formed in the same manner as described above with reference to FIG. 10G. Next, a planarization operation may be performed on the first and second regions R1 and R2 to remove the upper interlayer insulating layer 195. In embodiments, during the planarization operation, the sacrificial gate structures SG, the contact insulating layers 170, the contact plugs 180, and the interlayer insulating layer 190 may be partially removed from upper portions.

In some example embodiments, when contact insulating layers 170 is formed as an air-gap, a material of the contact insulating layer 170 deposited in this operation may be selectively removed.

Figure 10K:
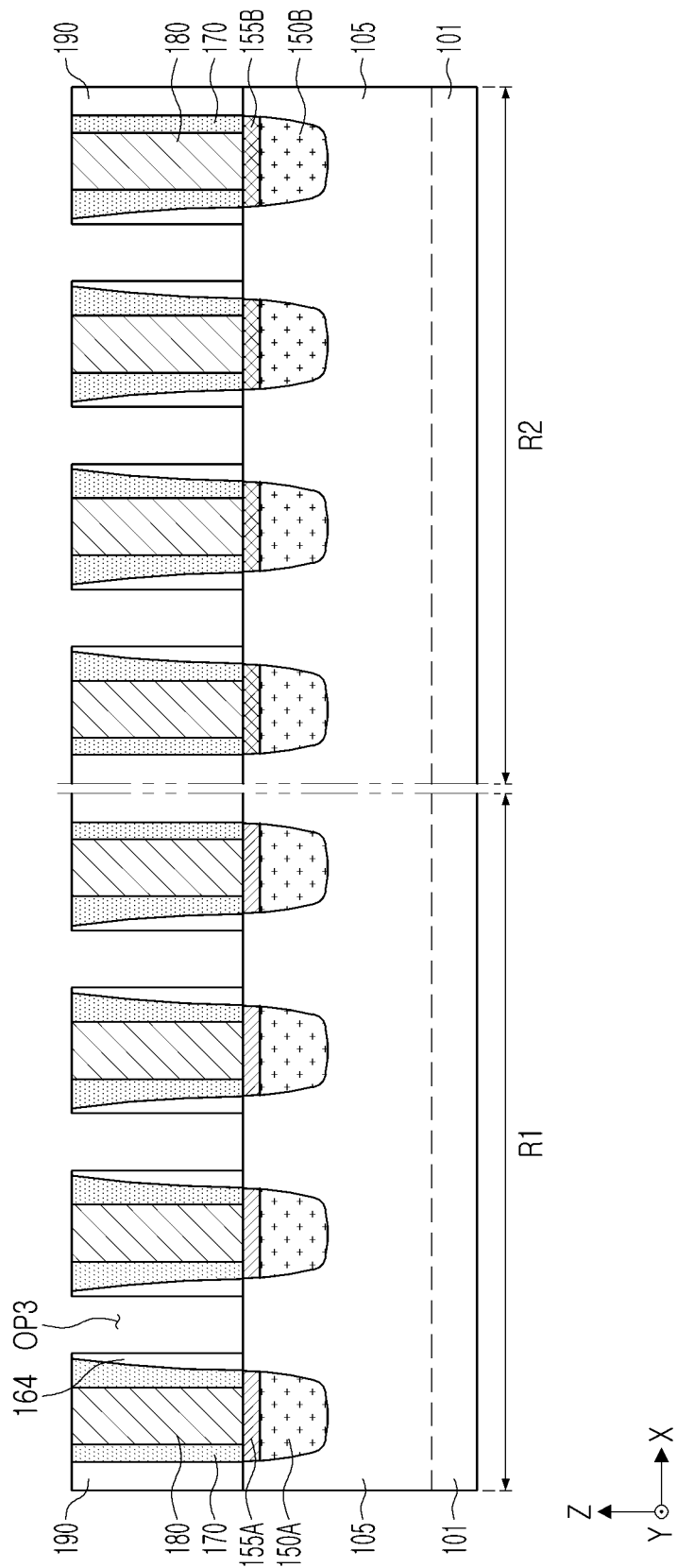

Referring to FIG. 10K, in the first and second regions R1 and R2, the sacrificial gate structure SG may be removed to form third openings OP3.

The sacrificial gate structure SG may be selectively removed with respect to the lower active regions 105 and the device isolation layer 110, below the sacrificial gate structure SG. The removal operation of the sacrificial gate structure SG may use at least one of a dry etching process or a wet etching process.

Next, referring to FIGS. 4A and 4B together, the gate insulating layers 162, the gate electrode layers 165, and the gate capping layers 166 may be formed in the third openings OP3 to finally form the gate structures 160.

The gate insulating layers 162 may be formed along lower surfaces of the third openings OP3, and may be formed to extend along side surfaces thereof in the upward direction. After the gate insulating layers 162, the gate electrode layers 165, and the gate capping layers 166 are formed, a material remaining on the interlayer insulating layer 190 may be removed using a planarization process such as a chemical mechanical polishing (CMP) process. In this operation, the gate capping layers 166 and the gate spacer layers 164 may also be partially removed from upper portions to lower heights thereof. In some example embodiments, an operation of forming the gate structures 160 may be performed before the formation of the first and second openings OP1 and OP2 described with reference to FIG. 10B.

After formation of a source/drain region, a contact insulating layer and a contact plug may be sequentially formed on the source/drain region to provide a semiconductor device having improved electrical characteristics.

Various advantages and effects of the present inventive concepts are not limited to the above description, which is provided in order to facilitate ready understanding of the present inventive concepts within a process of describing specific example embodiments of the present inventive concepts. Thus, while some examples of embodiments have been illustrated and described above, it will be apparent to those skilled in the art that modifications and variations could be made without departing from the scope of the present inventive concepts as defined by the appended claims.

What is claimed is:

1. A semiconductor device comprising:
    a substrate including an active region that extends in a first direction;
    a gate structure that extends in a second direction that intersects the first direction;
    a source/drain region on the active region on at least one side of the gate structure;
    a contact plug on the source/drain region on the at least one side of the gate structure;
    a contact insulating layer on sidewalls of the contact plug;
    an interlayer insulating layer on the substrate; and
    a sidewall insulating layer having a first portion that extends in parallel to an upper surface of the substrate and a second portion that extends away from the upper surface of the substrate and in parallel to an outer surface of the source/drain region, when viewed in a cross-sectional view along the second direction,
    wherein a lower end of the contact plug is located closer to the upper surface of the substrate than a lower end of the source/drain region is to the upper surface of the substrate, and
    wherein the contact insulating layer is between the interlayer insulating layer and the contact plug.

2. The semiconductor device according to claim 1, wherein the contact plug has a length in the second direction that is greater than a length of the source/drain region in the second direction.

3. The semiconductor device according to claim 1, wherein the contact insulating layer is spaced apart from an end portion of the source/drain region in the second direction.

4. The semiconductor device according to claim 1, wherein the contact insulating layer surrounds the contact plug, when viewed in a plan view.

5. The semiconductor device according to claim 1, wherein the source/drain region has an upper surface having a planar shape in the first direction, and
    wherein the contact plug is in contact with the upper surface of the source/drain region.

6. The semiconductor device according to claim 1, wherein the source/drain region includes a first surface that extends obliquely from the active region in an upward direction, when viewed in the cross-sectional view along the second direction, wherein the sidewall insulating layer is located on the first surface.

7. The semiconductor device according to claim 1, wherein the sidewall insulating layer overlaps the source/drain region, when viewed in a plan view.

8. The semiconductor device according to claim 1, wherein a lower surface of the gate structure is located equidistant from the substrate as a lower surface of the contact plug is to the substrate, or the lower surface of the gate structure is closer to the substrate than the lower surface of the contact plug is to the substrate.

9. The semiconductor device according to claim 1, further comprising a plurality of channel layers on the active region and spaced apart from each other in a vertical direction perpendicular to the first and second directions,
wherein the gate structure surrounds the plurality of channel layers.

10. The semiconductor device according to claim 1, wherein the sidewall insulating layer and the contact insulating layer comprise a same material.

11. A semiconductor device comprising:
a substrate including an active region that extends in a first direction;
a gate structure that extends in a second direction that intersects the active region;
a source/drain region on the active region on at least one side of the gate structure;
a contact plug on the source/drain region on the at least one side of the gate structure;
a contact insulating layer on sidewalls of the contact plug;
a sidewall insulating layer having a first portion that extends in parallel to an upper surface of the substrate and a second portion that extends upward and in parallel to an outer surface of the source/drain region, when viewed in a cross-sectional view along the second direction; and
an interlayer insulating layer on the substrate,
wherein the contact insulating layer is between the interlayer insulating layer and the contact plug and between the gate structure and the contact plug, when viewed in a plan view.

12. The semiconductor device according to claim 11, wherein the contact insulating layer surrounds the contact plug, when viewed in the plan view.

13. The semiconductor device according to claim 11, wherein a lower end of the contact plug is located closer to the substrate than a lower end of the source/drain region is to the substrate.

14. The semiconductor device according to claim 11, further comprising a plurality of channel layers on the active region and spaced apart from each other in a vertical direction perpendicular to the first and second directions,
wherein the gate structure surrounds the plurality of channel layers.

15. A semiconductor device comprising:
a substrate including active regions that extend in a first direction;
a device isolation layer that defines the active regions in the substrate;
gate structures including gate electrode layers that extend in a second direction that intersect the active regions;
source/drain regions on the active regions on at least one sides of the gate structures;
contact plugs on the source/drain regions on the at least one sides of the gate structures;
contact insulating layers that contact the gate structures and that surround sidewalls of the contact plugs; and
a sidewall insulating layer having a first portion that extends along and parallel to an upper surface of the device isolation layer and a second portion that extends upward and parallel to a lower portion of an outer surface of the source/drain regions, when viewed in a cross-sectional view along the second direction.

16. The semiconductor device according to claim 15, wherein the sidewall insulating layer contacts the contact plugs.

17. The semiconductor device according to claim 15, wherein a lower end of each of the contact plugs is closer to the substrate than a lower end of each of the source/drain regions is to the substrate.

18. The semiconductor device according to claim 15, wherein each of the contact insulating layers surrounds each of the contact plugs in a substantially uniform thickness.

19. The semiconductor device according to claim 15, further comprising an interlayer insulating layer on an outer side of each of the contact insulating layers.

* * * * *